United States Patent
Ji et al.

(10) Patent No.: US 11,448,807 B2
(45) Date of Patent: Sep. 20, 2022

(54) DISPLAY SUBSTRATE, FINE METAL MASK SET AND MANUFACTURING METHOD THEREOF

(71) Applicants: Chengdu BOE Optoelectronics Technology Co., Ltd., Sichuan (CN); BOE TECHNOLOGY GROUP CO., LTD., Beijing (CN)

(72) Inventors: Fengli Ji, Beijing (CN); Chang Luo, Beijing (CN); Jianpeng Wu, Beijing (CN); Lujiang Huangfu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 237 days.

(21) Appl. No.: 16/755,970

(22) PCT Filed: May 14, 2019

(86) PCT No.: PCT/CN2019/086875
§ 371 (c)(1),
(2) Date: Apr. 14, 2020

(87) PCT Pub. No.: WO2020/133885
PCT Pub. Date: Jul. 2, 2020

(65) Prior Publication Data
US 2021/0271010 A1    Sep. 2, 2021

Related U.S. Application Data

(63) Continuation-in-part of application No. 16/234,777, filed on Dec. 28, 2018, now Pat. No. 10,854,684,
(Continued)

(30) Foreign Application Priority Data

Feb. 18, 2016 (CN) .......................... 201620127445.0
Jul. 22, 2016 (CN) .......................... 201610585894.4
(Continued)

(51) Int. Cl.
*G02B 5/20* (2006.01)
*H01L 27/32* (2006.01)
(Continued)

(52) U.S. Cl.
CPC ............. *G02B 5/201* (2013.01); *G02F 1/136* (2013.01); *G02F 1/1362* (2013.01);
(Continued)

(58) Field of Classification Search
CPC ......... G09G 2300/0452; G09G 3/3225; G09G 2300/0426; H01L 27/3216; H01L 51/0011;
(Continued)

(56) References Cited

U.S. PATENT DOCUMENTS 4,491,863 A   1/1985  Kurahashi
4,652,912 A   3/1987  Masubuchi
(Continued)

FOREIGN PATENT DOCUMENTS

AU   2018408152 A1   10/2019
CN    101192382 A    6/2008
(Continued)

OTHER PUBLICATIONS

International Search Report of PCT/CN2019/086875 in Chinese, dated Sep. 25, 2019, with English translation.
(Continued)

*Primary Examiner* — Mariam Qureshi
(74) *Attorney, Agent, or Firm* — Collard & Roe, P.C.

(57) ABSTRACT

A display substrate, a fine metal mask set and a manufacturing method thereof are provided. The display substrate
(Continued)

includes a plurality of repeat units. Each of the plurality of repeat units includes one first-color sub-pixel, one second-color sub-pixel pair and one third-color sub-pixel which are arranged in a first direction, the second-color sub-pixel pair includes two second-color sub-pixels arranging in a second direction. Light-emitting layers of adjacent sub-pixels of two different colors in the first direction are connected with each other; light-emitting layers of the third-color sub-pixel and the second-color sub-pixel which are adjacent to each other in the second direction are connected with each other; and a spacing is disposed between the light-emitting layer of the first-color sub-pixel and the light-emitting layer of at least one of the second-color sub-pixel and the third-color sub-pixel which are adjacent to the first-color sub-pixel in the second direction.

20 Claims, 7 Drawing Sheets

Related U.S. Application Data which is a continuation-in-part of application No. 15/578,481, filed as application No. PCT/CN2017/075957 on Mar. 8, 2017, now abandoned, said application No. 16/234,777 is a continuation-in-part of application No. 15/536,347, filed as application No. PCT/CN2016/081097 on May 5, 2016, now Pat. No. 10,274,654.

(30) Foreign Application Priority Data

| | | | |
|---|---|---|---|
| Feb. 9, 2018 | (CN) | ........................ | 201810135947.1 |
| Feb. 9, 2018 | (CN) | ........................ | 201810135948.6 |
| Feb. 9, 2018 | (CN) | ........................ | 201810136335.4 |
| Feb. 9, 2018 | (CN) | ........................ | 201810137012.7 |
| Feb. 9, 2018 | (CN) | ........................ | 201810137014.6 |
| Feb. 9, 2018 | (CN) | ........................ | 201810137016.5 |
| Dec. 13, 2018 | (CN) | ........................ | 201811525578.3 |

(51) Int. Cl.
*G09F 9/33* (2006.01)
*G09F 9/302* (2006.01)
*G02F 1/1343* (2006.01)
*G02F 1/136* (2006.01)
*G02F 1/1362* (2006.01)

(52) U.S. Cl.
CPC ........ *G02F 1/134309* (2013.01); *G09F 9/302* (2013.01); *G09F 9/3023* (2013.01); *G09F 9/33* (2013.01); *H01L 27/3218* (2013.01); *G02F 1/134345* (2021.01)

(58) Field of Classification Search
CPC ........... H01L 27/3218; G02F 1/134345; G02F 1/1362; G02F 1/136; G02F 1/134309; G09F 9/33; G09F 9/3023; G09F 9/302; G02B 5/201
See application file for complete search history.

(56) References Cited

U.S. PATENT DOCUMENTS

| | | |
|---|---|---|
| 5,113,274 A | 5/1992 | Takahashi et al. |
| 5,341,153 A | 8/1994 | Benzschawel et al. |
| 6,768,482 B2 | 7/2004 | Asano et al. |
| 6,950,115 B2 | 9/2005 | Brown Elliott |
| 7,123,277 B2 | 10/2006 | Brown Elliott et al. |
| 7,525,526 B2 | 4/2009 | Brown Elliott et al. |
| 7,663,299 B2 | 2/2010 | Chao et al. |
| 7,733,359 B1 | 6/2010 | Hagge et al. |
| 8,159,508 B2 | 4/2012 | Lee |
| 8,330,352 B2 | 12/2012 | Sung et al. |
| 8,363,072 B2 | 1/2013 | Hong et al. |
| 8,446,435 B2 | 5/2013 | Tomizawa et al. |
| 8,754,913 B2 | 6/2014 | Hwang et al. |
| 8,994,015 B2 | 3/2015 | Pyon et al. |
| 9,337,241 B2 | 5/2016 | Lee et al. |
| 9,343,511 B1 | 5/2016 | Feng |
| 9,424,771 B2 | 8/2016 | Gong |
| 9,570,706 B2 | 2/2017 | Yim et al. |
| 9,647,039 B1 | 5/2017 | Wang et al. |
| 9,704,926 B2 | 7/2017 | Kim |
| 9,734,753 B2 | 8/2017 | Li et al. |
| 9,818,803 B2 | 11/2017 | Lee |
| 9,871,085 B2 | 1/2018 | Cho et al. |
| 9,905,604 B2 | 2/2018 | Murata |
| 9,946,123 B2 | 4/2018 | Huangfu et al. |
| 9,984,624 B2 | 5/2018 | Takahashi et al. |
| 10,181,499 B2 | 1/2019 | Jo et al. |
| 10,210,787 B2 | 2/2019 | Jin |
| 10,274,654 B2 | 4/2019 | Jin et al. |
| 10,283,086 B1 | 5/2019 | Su et al. |
| 10,373,541 B2 | 8/2019 | Lee et al. |
| 10,504,483 B2 | 12/2019 | Chen et al. |
| 10,565,918 B2 | 2/2020 | Wu et al. |
| 10,699,642 B2 | 6/2020 | Ma et al. |
| 10,854,684 B2 | 12/2020 | Huangfu et al. |
| 10,861,905 B2 | 12/2020 | Wang |
| 10,867,545 B2 | 12/2020 | Kirisken |
| 10,909,901 B2 | 2/2021 | Wu et al. |
| 10,943,955 B2 | 3/2021 | Wang et al. |
| 10,991,768 B2 | 4/2021 | Li et al. |
| 11,069,286 B2 | 7/2021 | Tan et al. |
| 11,233,096 B2 | 1/2022 | Huangfu et al. |
| 11,238,816 B2 | 2/2022 | Huangfu et al. |
| 11,264,430 B2 | 3/2022 | Huangfu et al. |
| 2005/0018110 A1 | 1/2005 | Liu |
| 2007/0205423 A1 | 9/2007 | Yamazaki et al. |
| 2007/0290973 A1 | 12/2007 | Wei |
| 2008/0001525 A1 | 1/2008 | Chao et al. |
| 2009/0121983 A1 | 5/2009 | Sung et al. |
| 2009/0128900 A1 | 5/2009 | Grasnick |
| 2009/0302331 A1 | 12/2009 | Smith et al. |
| 2010/0289732 A1 | 11/2010 | Ina et al. |
| 2011/0025723 A1 | 2/2011 | Kim |
| 2011/0128262 A1 | 6/2011 | Chaji et al. |
| 2011/0234550 A1 | 9/2011 | Hong et al. |
| 2011/0260951 A1 | 10/2011 | Hwang et al. |
| 2011/0291549 A1 | 12/2011 | Kim et al. |
| 2011/0291550 A1 | 12/2011 | Kim et al. |
| 2012/0025182 A1 | 2/2012 | Umeda et al. |
| 2012/0039034 A1 | 2/2012 | Jepsen et al. |
| 2012/0092238 A1 | 4/2012 | Hwang et al. |
| 2012/0313844 A1 | 12/2012 | Im et al. |
| 2013/0234917 A1* | 9/2013 | Lee ..................... H01L 27/3218 345/82 |
| 2014/0003045 A1 | 1/2014 | Lee et al. |
| 2014/0198479 A1 | 7/2014 | Chao et al. |
| 2014/0220715 A1 | 8/2014 | Kang |
| 2014/0226323 A1 | 8/2014 | Huang et al. |
| 2014/0252321 A1 | 9/2014 | Pyon et al. |
| 2014/0284570 A1 | 9/2014 | Jinta et al. |
| 2014/0292622 A1 | 10/2014 | Lee |
| 2014/0346537 A1 | 11/2014 | Xi |
| 2015/0008820 A1 | 1/2015 | Lee |
| 2015/0015465 A1 | 1/2015 | Gong |
| 2015/0021637 A1 | 1/2015 | Ahn et al. |
| 2015/0062140 A1 | 3/2015 | Levantovsky et al. |
| 2015/0102320 A1 | 4/2015 | Jung |
| 2015/0162391 A1 | 6/2015 | Kim |
| 2015/0162394 A1 | 6/2015 | Tokuda et al. |
| 2015/0270317 A1 | 9/2015 | Lee et al. |
| 2015/0311264 A1 | 10/2015 | Shen et al. |
| 2015/0364525 A1 | 12/2015 | Lin et al. |
| 2016/0049438 A1 | 2/2016 | Murata |
| 2016/0078807 A1 | 3/2016 | Sun et al. |

(56) References Cited

U.S. PATENT DOCUMENTS

| | | | |
|---|---|---|---|
| 2016/0126295 A1* | 5/2016 | Sato | H01L 27/3218 257/89 |
| 2016/0126296 A1 | 5/2016 | Feng | |
| 2016/0126298 A1 | 5/2016 | Chen | |
| 2016/0155781 A1 | 6/2016 | Chaji | |
| 2016/0171918 A1 | 6/2016 | Kim et al. | |
| 2016/0190523 A1 | 6/2016 | Kim et al. | |
| 2016/0196776 A1 | 7/2016 | Yang et al. | |
| 2016/0240593 A1 | 8/2016 | Gu et al. | |
| 2016/0253943 A1 | 9/2016 | Wang | |
| 2016/0254476 A1 | 9/2016 | Park | |
| 2016/0293678 A1 | 10/2016 | Wang | |
| 2016/0343284 A1 | 11/2016 | Sun | |
| 2016/0351119 A1 | 12/2016 | Ono | |
| 2016/0357076 A1 | 12/2016 | Huangfu et al. | |
| 2016/0358536 A1 | 12/2016 | Li et al. | |
| 2016/0358985 A1 | 12/2016 | Bai et al. | |
| 2016/0370919 A1 | 12/2016 | Xu et al. | |
| 2017/0039924 A1 | 2/2017 | Jin | |
| 2017/0133440 A1 | 5/2017 | Wang et al. | |
| 2017/0193880 A1 | 7/2017 | Lee et al. | |
| 2017/0294491 A1 | 10/2017 | Jo et al. | |
| 2017/0317150 A1 | 11/2017 | Chung et al. | |
| 2017/0352710 A1 | 12/2017 | Hong et al. | |
| 2018/0012547 A1 | 1/2018 | Li et al. | |
| 2018/0088260 A1 | 3/2018 | Jin et al. | |
| 2018/0090549 A1 | 3/2018 | Hamada et al. | |
| 2018/0097043 A1 | 4/2018 | Song | |
| 2018/0182828 A1 | 6/2018 | Kim | |
| 2018/0247984 A1 | 8/2018 | Wang et al. | |
| 2018/0292695 A1 | 10/2018 | You et al. | |
| 2018/0308412 A1 | 10/2018 | Wu et al. | |
| 2018/0308907 A1 | 10/2018 | Jin et al. | |
| 2018/0355466 A1 | 12/2018 | Mu | |
| 2019/0004648 A1 | 1/2019 | Xu et al. | |
| 2019/0035859 A1 | 1/2019 | Kang et al. | |
| 2019/0066564 A1 | 2/2019 | Tan | |
| 2019/0088726 A1 | 3/2019 | Zhang | |
| 2019/0096962 A1 | 3/2019 | Han et al. | |
| 2019/0115399 A1 | 4/2019 | Jo et al. | |
| 2019/0139513 A1 | 5/2019 | Su et al. | |
| 2019/0140030 A1 | 5/2019 | Huangfu et al. | |
| 2019/0206341 A1 | 7/2019 | Liao et al. | |
| 2019/0237518 A1 | 8/2019 | Sun et al. | |
| 2019/0326365 A1 | 10/2019 | Jin | |
| 2019/0340970 A1 | 11/2019 | Kirisken | |
| 2020/0013833 A1 | 1/2020 | Wang et al. | |
| 2020/0035172 A1 | 1/2020 | Chen | |
| 2020/0043990 A1 | 2/2020 | Huangfu et al. | |
| 2020/0051485 A1 | 2/2020 | Liu et al. | |
| 2020/0058713 A1 | 2/2020 | Zhang | |
| 2020/0119107 A1 | 4/2020 | Liu et al. | |
| 2020/0258441 A1 | 8/2020 | Zhang et al. | |
| 2020/0328259 A1* | 10/2020 | Joe | G09G 3/3208 |
| 2020/0357862 A1 | 11/2020 | Wang et al. | |
| 2021/0091145 A1 | 3/2021 | Huangfu et al. | |
| 2021/0335297 A1 | 10/2021 | Huangfu et al. | |

FOREIGN PATENT DOCUMENTS

| | | |
|---|---|---|
| CN | 101582241 A | 11/2009 |
| CN | 101339729 B | 6/2010 |
| CN | 102201430 A | 9/2011 |
| CN | 101582241 B | 10/2011 |
| CN | 103681754 A | 3/2014 |
| CN | 104037202 A | 9/2014 |
| CN | 104051493 A | 9/2014 |
| CN | 104269411 A | 1/2015 |
| CN | 104282727 A | 1/2015 |
| CN | 104332486 A | 2/2015 |
| CN | 104362170 A | 2/2015 |
| CN | 104597655 A | 5/2015 |
| CN | 104637987 A | 5/2015 |
| CN | 104701341 A | 6/2015 |
| CN | 104795431 A | 7/2015 |
| CN | 104882464 A | 9/2015 |
| CN | 105280139 A | 1/2016 |
| CN | 205231065 U | 5/2016 |
| CN | 205355055 U | 6/2016 |
| CN | 105741774 A | 7/2016 |
| CN | 205608350 U | 9/2016 |
| CN | 106094334 A | 11/2016 |
| CN | 205845956 U | 12/2016 |
| CN | 106293244 A | 1/2017 |
| CN | 106601167 A | 4/2017 |
| CN | 106782307 A | 5/2017 |
| CN | 104597655 B | 6/2017 |
| CN | 106935618 A | 7/2017 |
| CN | 106935630 A | 7/2017 |
| CN | 106991957 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 108258013 A | 7/2018 |
| CN | 207781607 U | 8/2018 |
| CN | 207781608 U | 8/2018 |
| CN | 108493221 A | 9/2018 |
| CN | 207883217 U | 9/2018 |
| CN | 109491158 A | 3/2019 |
| CN | 109559679 A | 4/2019 |
| EP | 2 680 310 A1 | 1/2014 |
| EP | 3 270 216 A1 | 1/2018 |
| EP | 3 306 598 A1 | 4/2018 |
| JP | 2002-221917 A | 8/2002 |
| JP | 2008-015521 A | 1/2008 |
| JP | 2010-212814 A | 9/2010 |
| JP | 2016-090991 A | 5/2016 |
| KR | 10-2009-0049515 A | 5/2009 |
| KR | 10-2011-0108050 A | 10/2011 |
| KR | 10-1347995 B1 | 1/2014 |
| KR | 10-2015-0006668 A | 1/2015 |
| KR | 10-2016-0051511 A | 5/2016 |
| KR | 10-2017-0116556 A | 10/2017 |
| RU | 2 453 879 C2 | 6/2012 |
| RU | 2 721 902 C1 | 5/2020 |
| WO | 2016/192241 A1 | 12/2016 |
| WO | 2017/140038 A1 | 8/2017 |
| WO | 2018/014562 A1 | 1/2018 |
| WO | 2019084932 A1 | 5/2019 |
| WO | 2019134514 A1 | 7/2019 |
| WO | 2019134522 A1 | 7/2019 |
| WO | 2019153949 A1 | 8/2019 |
| WO | 2020124693 A1 | 6/2020 |

OTHER PUBLICATIONS

Notice of Transmittal of the International Search Report of PCT/CN2019/086875 in Chinese, dated Sep. 25, 2019.
Written Opinion of the International Searching Authority of PCT/CN2019/086875 in Chinese, dated Sep. 25, 2019.
International Search Report of PCT/CN2019/098705 in Chinese, dated May 6, 2020, with English translation.
Notice of Transmittal of the International Search Report of PCT/CN2019/098705 in Chinese, dated May 6, 2020.
Written Opinion of the International Searching Authority of PCT/CN2019/098705 in Chinese, dated May 6, 2020, with English translation.
International Search Report of PCT/CN2019/098707 in Chinese, dated May 9, 2020, with English translation.
Notice of Transmittal of the International Search Report of PCT/CN2019/098707 in Chinese, dated May 9, 2020.
Written Opinion of the International Searching Authority of PCT/CN2019/098707 in Chinese, dated May 9, 2020, with English translation.
International Search Report of PCT/CN2019/097765, dated Oct. 28, 2019.

(56) References Cited

OTHER PUBLICATIONS

Written Opinion of the International Searching Authority of PCT/CN2019/097765, dated Oct. 28, 2019.
Korean Office Action in Korean Application No. 10-2021-7030323 dated Jan. 25, 2022 with English translation.
U.S. Office Action in U.S. Appl. No. 16/621,904 dated Mar. 15, 2022.
First Office Action in U.S. Appl. No. 16/621,918 dated Sep. 29, 2020.
First Office Action in U.S. Appl. No. 16/600,316 dated Oct. 6, 2020.
Japanese Office Action in Japanese Application No. 2017-544608, dated Oct. 12, 2020 with English translation.
Indian Office Action in Indian Application No. 202017026082 dated May 25, 2021 with English translation.
Park et al, Luminance Uniformity of Large-Area OLEDs with an Auxiliary Metal Electrode, Journal of Display Technology, Aug. 2009, pp. 306-311, vol. 5, No. 8.
Candice H. Brown Elliot, "Reducing Pixel Count Without Reducing Image Quality", Information display, vol. 1999 (12): 22-25, 1999 (4 pages).
Lu Fang et al., "Subpixel Rendering: From Font Rendering to Image Subsampling", IEEE Signal Processing Magazine, vol. 2013 (5): 177-182 and 189, 2013 (7 pages).
Dean S. Messing, Scott Daly, "Improved Display Resolution of Subsampled Colour Images Using Subpixel Addressing", IEEE ICIP 2002: I-625-628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
International Search Report of PCT/CN2018/124890 in Chinese, dated Mar. 27, 2019, with English translation.
International Preliminary Report on Patentability of PCT/CN2018/124890, dated Aug. 11, 2020 and English Translation of the Written Opinion of the International Searching Authority of PCT/CN2018/124890, dated Mar. 27, 2019.
International Search Report of PCT/CN2018/124881 in Chinese, dated Mar. 26, 2019, with English translation.
International Preliminary Report on Patentability of PCT/CN2018/124881, dated Aug. 11, 2020 and English Translation of the Written Opinion of the International Searching Authority of PCT/CN2018/124881, dated Mar. 26, 2019.
International Search Report of PCT/CN2018/124884 in Chinese, dated Mar. 27, 2019, with English translation.
International Preliminary Report on Patentability of PCT/CN2018/124884, dated Aug. 11, 2020 and English Translation of the Written Opinion of the International Searching Authority of PCT/CN2018/124884, dated Mar. 27, 2019.
International Search Report of PCT/CN2018/124445 in Chinese, dated Mar. 21, 2019, with English translation.
International Preliminary Report on Patentability of PCT/CN2018/124445, dated Aug. 11, 2020 and English Translation of the Written Opinion of the International Searching Authority of PCT/CN2018/124445, dated Mar. 19, 2019.
International Search Report of PCT/CN2018/124404 in Chinese, dated Mar. 14, 2019, with English translation.
International Preliminary Report on Patentability of PCT/CN2018/124404, dated Aug. 11, 2020 and English Translation of the Written Opinion of the International Searching Authority of PCT/CN2018/124404, dated Mar. 14, 2019.
International Search Report of PCT/CN2016/081097 in Chinese, dated Nov. 16, 2016, with English translation.
International Preliminary Report on Patentability of PCT/CN2016/081097, dated Aug. 21, 2018 and English Translation of the Written Opinion of the International Searching Authority of PCT/CN2016/081097, dated Nov. 16, 2016.
First Office Action in U.S. Appl. No. 15/536,347 dated Aug. 28, 2018.
International Search Report of PCT/CN2017/075957 in Chinese, dated Jun. 8, 2017.
International Preliminary Report on Patentability of PCT/CN2017/075957, dated Jan. 22, 2019 and Written Opinion of the International Searching Authority of PCT/CN2017/075957, dated Jun. 8, 2017.
Indian Office Action in Indian Application No. 201717038562, dated Oct. 15, 2019.
First Office Action in U.S. Appl. No. 15/578,481 dated Feb. 1, 2019.
Non-Final Office Action in U.S. Appl. No. 15/578,481 dated Jul. 11, 2019.
English translation of Extended European Search Report in EP Application No. 17768339.8 dated Dec. 6, 2019.
Korean Office Action in Korean Application No. 10-2017-7022698, dated May 29, 2019 with English translation.
Korean Notice of Allowance in Korean Application No. 10-2017-7022698, dated Mar. 6, 2020.
Chinese Office Action in Chinese Application No. 201810135947.1, dated Mar. 3, 2020 with English translation.
Russian Notice of Allowance in Russian Application No. 2019130488, dated Mar. 18, 2020 with English Translation.
First Office Action in U.S. Appl. No. 16/492,930 dated Jul. 24, 2020.
Korean Office Action in Korean Application No. 10-2019-7024785, dated Jul. 30, 2020 with English translation.
Notice of Allowance in U.S. Appl. No. 16/234,777 dated Sep. 1, 2020.
Notice of Allowance in U.S. Appl. No. 16/630,496 dated Mar. 26, 2021.
Notice of Allowance in U.S. Appl. No. 16/600,316 dated Apr. 14, 2021.
English translation of Extended European Search Report in EP Application No. 21152119.0 dated May 11, 2021.
Extended European Search Report in European Application No. 18905189.9 dated Oct. 19, 2021.
Extended European Search Report in European Application No. 18903035.6 dated Nov. 8, 2021.
Indian Office Action in Indian Application No. 202027048001 dated Dec. 6, 2021 with English translation.
U.S. Office Action in U.S. Appl. No. 16/622,045 dated Dec. 21, 2021.
U.S. Non-Final Office Action in U.S. Appl. No. 16/621,904 dated Aug. 2, 2021.
Indian Office Action in Indian Application No. 202017027785 dated Aug. 19, 2021 with English translation.
Korean Written Decision of Dismissal of Amendment in Korean Application No. 10-2019-7027773 dated Aug. 24, 2021 with English translation.
U.S. Non-Final Office Action in U.S. Appl. No. 16/483,210 dated Sep. 22, 2021.
European Extended Search Report in European Patent Application No. 18905693.0 dated Oct. 1, 2021.
Korean Office Action in Korean Application No. 10-2019-7027773, dated Dec. 25, 2020 with English translation.
Chinese Office Action in Chinese Application No. 201680082630.5 dated Apr. 1, 2022.
U.S. Office Action in U.S. Appl. No. 17/497,630 dated May 12, 2022.
Korean Office Action in Korean Application No. 10-2021-7030323 dated Jul. 6, 2022 with English translation.
Extended European Search Report in European Application No. 19933217.2 dated Jul. 5, 2022.

\* cited by examiner

DISPLAY SUBSTRATE, FINE METAL MASK SET AND MANUFACTURING METHOD THEREOF

CROSS REFERENCE TO RELATED APPLICATIONS

This application is a national stage application of PCT/CN2019/086875 filed on May 14, 2019 which international application claims priority from U.S. patent application Ser. No. 16/234,777 filed on Dec. 28, 2018. (hereinafter the '777 application).

The '777 application claims priority under 35 U.S.C. 119 to the following Chinese Applications CN201810135947.1 filed on Feb. 9, 2018, CN201810137012.7 filed on Feb. 9, 2018, CN201810136335.4 filed on Feb. 9, 2018, CN201810135948.6 filed on Feb. 9, 2018, CN201810137016.5 filed on Feb. 9, 2018, CN201810137014.6 filed on Feb. 9, 2018, CN 201811525578.3, filed on Dec. 13, 2018.

The '777 application is also a continuation in part application of Ser. No. 15/578,481 filed on Nov. 30, 2017 now abandoned (hereinafter the '481 application). The '481 application is a national stage application of PCT/CN2017/075957 filed on Mar. 8, 2017, and which claims priority to CN201610585894.4 filed on Jul. 22, 2016.

The '777 application is also a continuation in part application of Ser. No. 15/536,347 filed on Jun. 15, 2017 (hereinafter the '347 application) now issued as U.S. Pat. No. 10,274,654 on Apr. 30, 2019. The '347 application is a national stage application of PCT/CN2016/081097 filed on May 5, 2016 wherein that application claims priority to CN 201620127445.0 filed on Feb. 18, 2016. The disclosures of all of these above applications are hereby incorporated herein by reference in their entirety.

In addition, this application incorporates by reference in their entirety the following applications: U.S. patent application Ser. No. 16/600,316, filed on Oct. 11, 2019, PCT/CN2019/098705 filed on Jul. 31, 2019, PCT/CN2019/098707 filed on Jul. 31, 2019, PCT/CN2018/124445 filed on Dec. 27, 2018 which was filed as national stage U.S. application Ser. No. 16/621,918 filed on Dec. 12, 2019, PCT/CN2018/124890 filed on Dec. 28, 2018, which was filed as national stage U.S. application Ser. No. 16/492,930 filed on Sep. 10, 2019, PCT/CN2018/124404 filed on Dec. 27, 2018, which was filed as national stage U.S. application Ser. No. 16/483,210 filed on Aug. 2, 2019, PCT/CN2018/124881 filed on Dec. 28, 2018, which was filed as national stage U.S. application Ser. No. 16/622,045 filed on Dec. 12, 2019, PCT/CN2018/124884 filed on Dec. 28, 2018, which was filed as national stage U.S. application Ser. No. 16/621,904 filed on Dec. 12, 2019, PCT/CN2018/124386 filed on Dec. 27, 2018 which was filed as national stage U.S. application Ser. No. 16/630,496 filed on Jan. 13, 2020, and PCT/CN2019/097765 filed on Jul. 25, 2019 which was filed as national stage U.S. application Ser. No. 16/626,559 filed on Dec. 25, 2019.

TECHNICAL FIELD

At least one embodiment of the present disclosure relates to a display substrate, a fine metal mask set and a manufacturing method thereof.

BACKGROUND

With continuous development of display technologies, people demand higher and higher on a resolution of a display. According to differences in discerning resolutions of sub-pixels of different colors by human eyes, a density of the physical sub-pixels can be reduced by a virtual pixel method of changing an arrangement mode of sub-pixels of three colors, i.e., red, green and blue sub-pixels (e.g., sharing part of the sub-pixels) to reduce the number of the sub-pixels on a premise of forming images with the same resolution, so as to reduce process difficulty in the manufacturing process of a display device, promote yield and reduce cost.

Currently, a production process of an organic light-emitting diode (OLED) display apparatus includes evaporation coating, i.e., utilizing a fine metal mask (FMM) to evaporate a light-emitting layer of a pixel structure of an organic light-emitting diode. For example, the organic light-emitting diode display apparatus may include sub-pixels of three colors, and the production process of the OLED display apparatus can utilize three types of fine metal masks to respectively prepare such sub-pixels of three colors.

SUMMARY

At least one embodiment of the present disclosure relates to a display substrate, a fine metal mask set and a manufacturing method thereof.

At least one embodiment of the present disclosure provides a display substrate, which includes: a base substrate; and a plurality of repeat units on the base substrate. Each of the plurality of repeat units includes one first-color sub-pixel, one second-color sub-pixel pair and one third-color sub-pixel which are arranged in a first direction, the second-color sub-pixel pair includes two second-color sub-pixels arranging in a second direction, the plurality of repeat units are arranged in the first direction to form a plurality of repeat unit groups, the plurality of repeat unit groups are arranged in the second direction, and adjacent repeat unit groups in the plurality of repeat unit groups are staggered from each other in the first direction. Each sub-pixel includes a light-emitting layer, and light-emitting layers of adjacent sub-pixels of two different colors in the first direction are connected with each other; light-emitting layers of the third-color sub-pixel and the second-color sub-pixel which are adjacent to each other in the second direction are connected with each other; and a spacing is disposed between the light-emitting layer of at least one of the second-color sub-pixel and the third-color sub-pixel which are adjacent to the first-color sub-pixel in the second direction and the light-emitting layer of the first-color sub-pixel.

For example, light-emitting layers of the two second-color sub-pixels included in the second-color sub-pixel pair are integrated with each other.

For example, in at least one of the plurality of repeat units, an orthogonal projection of one of the light-emitting layer of the second-color sub-pixel pair and the light-emitting layer of the third-color sub-pixel on the base substrate has a maximum area, and an orthogonal projection of the light-emitting layer of the first-color sub-pixel on the base substrate has a minimum area.

For example, each of the first-color sub-pixel and the third-color sub-pixel includes a light-emitting region covering a center of the light-emitting layer and a non-light-emitting region surrounding the light-emitting region, the second-color sub-pixel pair includes two light-emitting regions covering the light-emitting layer and a non-light-emitting region surrounding the two light-emitting regions, the two light-emitting regions are located on both sides of a center of the light-emitting layer in the second direction, and in at least one of the plurality of repeat units, an area of the light-emitting region of the third-color sub-pixel is greater than an area of the light-emitting region of the second-color sub-pixel and an area of the light-emitting region of the first-color sub-pixel.

For example, the light-emitting layer of the first-color sub-pixel, the light-emitting layer of the second-color sub-pixel pair and the light-emitting layer of the third-color sub-pixel have a shape of a hexagon or an oval.

For example, the light-emitting region of the first-color sub-pixel and the light-emitting region of the third-color sub-pixel have a shape of the hexagon or the oval, and the light-emitting region of each second-color sub-pixel in the second-color sub-pixel pair has a shape of a pentagon, a circle or a waterdrop shape.

For example, in the first-color sub-pixel and the third-color sub-pixel, a region of the light-emitting layer outside a portion covered by the light-emitting region has an annular shape with approximately equal widths everywhere, and in the second-color sub-pixel pair, a region of the light-emitting layer except a portion covered by the light-emitting regions and a portion between mutually opposite edges of the light-emitting regions of the two second-color sub-pixels has an annular shape with approximately equal widths everywhere.

For example, widths of the annular shapes of sub-pixels of different colors are approximately equal to each other.

For example, in each of the plurality of repeat units, a shortest distance between edges of the light-emitting regions of adjacent sub-pixels of two different colors is in a range of 15 to 30 micrometers.

For example, in at least one of the plurality of repeat units, a size of the light-emitting layer of the third-color sub-pixel in the first direction is maximum, and a size of the light-emitting layer of the first-color sub-pixel in the first direction is minimum.

For example, in at least one of the plurality of repeat units, a size of the light-emitting layer of the second-color sub-pixel pair in the second direction is maximum, and a size of the light-emitting layer of the third-color sub-pixel in the second direction is minimum.

For example, for the light-emitting layers of sub-pixels of different colors, ratios of a size in the first direction to a size in the second directions are different.

For example, in at least one of the plurality of repeat units, a size of the light-emitting region of the third-color sub-pixel in the first direction is maximum, and a size of the light-emitting region of the first-color sub-pixel in the first direction is minimum; and in at least one of the plurality of repeat units, a size of the light-emitting region of the first-color sub-pixel and a size of the light-emitting region of the third-color sub-pixel in the second direction are approximately equal, and a size of the light-emitting region of the second-color sub-pixel in the second direction is minimum.

For example, a region of the light-emitting layer of the first-color sub-pixel outside a portion covered by the light-emitting region has an annular shape, a width of the annular shape in the first direction is smaller than a width of the annular shape in a third direction, and the third direction is parallel to a shortest connection line between mutually opposite edges of the light-emitting region of the first-color sub-pixel and the light-emitting region of the second-color sub-pixel, which are adjacent to each other in the second direction.

For example, a midpoint of the shortest connection line is located on a boundary of the light-emitting layer of the first-color sub-pixel.

For example, the light-emitting layer of the first-color sub-pixel and the light-emitting layer of the third-color sub-pixel include edges parallel to the second direction, and a midpoint of a shortest connection line between edges, which are opposite to each other in the first direction, of the light-emitting layer of the first-color sub-pixel and the light-emitting layer of the third-color sub-pixel which are adjacent to each other in the first direction and a center of the light-emitting layer of the second-color sub-pixel pair adjacent to the third-color sub-pixel in the second direction are located on a same straight line parallel to the second direction.

For example, in the first direction, a sum of the size of the light-emitting layer of the first-color sub-pixel and the size of the light-emitting layer of the third-color sub-pixel is approximately twice of the size of the light-emitting layer of the second-color sub-pixel pair.

For example, the first-color sub-pixel is a red sub-pixel, the second-color sub-pixel is a green sub-pixel, and the third-color sub-pixel is a blue sub-pixel.

For example, each sub-pixel further includes a pixel defining layer, and the pixel defining layer includes an opening for defining the light-emitting region of each sub-pixel.

For example, a spacing between the light-emitting layer of the third-color sub-pixel and the light-emitting layer of the first-color sub-pixel, which are adjacent to each other in the second direction, is greater than a spacing between the light-emitting layer of the second-color sub-pixel and the light-emitting layer of the first-color sub-pixel, which are adjacent to each other in the second direction.

For example, the size of the light-emitting region of the first-color sub-pixel in the first direction is greater than 10 micrometers.

For example, a minimum distance between the light-emitting layers of sub-pixels of a same color except the second-color sub-pixels is not smaller than a range of 10 micrometers to 20 micrometers, a minimum distance between boundaries of the light-emitting layers, which are close to each other, of two second-color sub-pixel pairs respectively located in different repeat unit groups is not smaller than a range of 10 micrometers to 20 micrometers, and a minimum distance between the boundaries of the light-emitting layers, which are close to each other, of two second-color sub-pixel pairs located in a same repeat unit group is not smaller than a range of 10 micrometers to 20 micrometers.

For example, in the first direction, a minimum size of the light-emitting layer of each sub-pixel is not smaller than 25 micrometers.

At least one embodiment of the present disclosure provides a fine metal mask set for evaporating the display substrate, which includes: a first mask, including a plurality of first openings, each first opening being used for forming the light-emitting layer of the first-color sub-pixel; a second mask, including a plurality of second openings, each second opening being used for simultaneously forming light-emitting layers of the two second-color sub-pixels of the second-color sub-pixel pair; and a third mask, including a plurality of third openings, each third opening being used for forming the light-emitting layer of the third-color sub-pixel. Two openings for evaporating light-emitting layers of adjacent sub-pixels of two different colors in at least one of the plurality of repeat unit groups are configured to have orthogonal projections on the display substrate with boundaries connected with each other; the third opening and the second opening which are respectively used for evaporating the light-emitting layer of the third-color sub-pixel and the light-emitting layer of the second-color sub-pixel pair which are adjacent to each other in the second direction are configured to have orthogonal projections on the display substrate, which are connected; and the first opening for evaporating the light-emitting layer of the first-color sub-pixel and at least one of the second opening for evaporating the light-emitting layer of the second-color sub-pixel pair and the third opening for evaporating the light-emitting layer of the third-color sub-pixel which are adjacent to the first-color sub-pixel in the second direction are configured to have orthogonal projections on the display substrate, which are spaced.

For example, a shape of each first opening is approximately the same as a shape of the light-emitting layer of the first-color sub-pixel; a shape of each second opening is approximately the same as a shape of the light-emitting layer of the second-color sub-pixel pair; and a shape of each third opening is approximately the same as a shape of the light-emitting layer of the third-color sub-pixel.

For example, a minimum distance between adjacent ones of the plurality of first openings is not smaller than 10 micrometers to 20 micrometers, a minimum distance between adjacent ones of the plurality of second openings is not smaller than 10 micrometers to 20 micrometers, and a minimum distance between adjacent ones of the plurality of third openings is not smaller than 10 micrometers to 20 micrometers.

At least one embodiment of the present disclosure provides a method for manufacturing the display substrate by using the fine metal mask set as mentioned above, which includes: forming the light-emitting layer of the first-color sub-pixel on the base substrate by using the first opening of the first mask; forming light-emitting layers of the two second-color sub-pixels of the second-color sub-pixel pair simultaneously on the base substrate by using the second opening of the second mask; and forming the light-emitting layer of the third-color sub-pixel on the base substrate by using the third opening of the third mask. The light-emitting layers, which are formed by using the fine metal mask set, of adjacent sub-pixels of two different colors in the first direction are connected with each other; the light-emitting layers, which are respectively formed by using the third opening of the third mask and the second opening of the second mask, of the third-color sub-pixel and the second-color sub-pixel which are adjacent to each other in the second direction are connected with each other; and a spacing is formed between the light-emitting layer of the first-color sub-pixel and the light-emitting layer, which is formed by using the fine metal mask set, of at least one of the second-color sub-pixel and the third-color sub-pixel which are adjacent to the first-color sub-pixel in the second direction.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
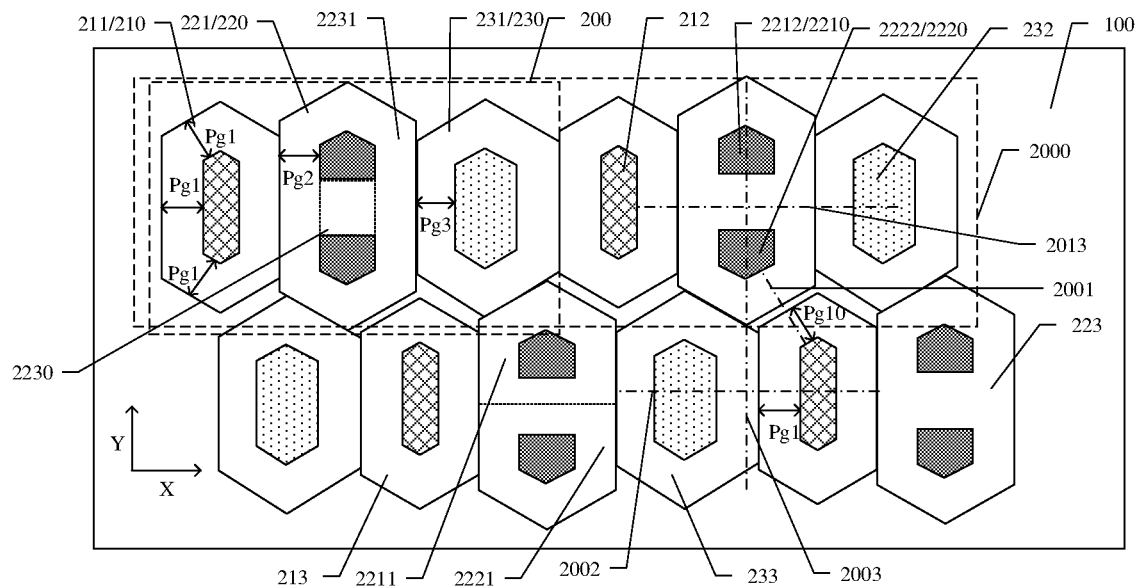
FIG. 1A is a partial structural schematic diagram of a display substrate provided by an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

A production process of an OLED display panel includes evaporation coating, and the production process needs to use a fine metal mask (FMM). With continuous development of display technologies, people demand higher and higher on a resolution of a display, but the demand on the high resolution of the display will increase difficulty of production process and increase production cost. Currently, in order to reduce the difficulty of the production process and reduce cost, a pixel arrangement can adopt a pentile mode (i.e., a pixel borrowing mode) with an algorithm. According to differences in discerning resolutions of sub-pixels of different colors by human eyes (the human eyes are most sensitive to a green sub-pixel), currently the pixel arrangement using the algorithm adopts an arrangement mode in which resolutions of a red sub-pixel and a blue sub-pixel are lower than resolutions of real red sub-pixel and blue sub-pixel and a resolution of the green sub-pixel is unchanged, and for example, the above-mentioned pixel arrangement includes a diamond-shaped pixel arrangement.

In a current pixel arrangement design, generally a manual estimation method is adopted, in which a dimension of each sub-pixel is roughly estimated by parameters such as each pixel size, an opening ratio and the like, then a first-edition pixel arrangement is drawn by using CAD software and then is adjusted according to each parameter so as to obtain a final pixel arrangement. Before the pixel arrangement is designed, the parameters which need to be determined include a PDL gap, a ratio of opening rates of sub-pixels of different colors, a size of the sub-pixel, minimum sizes of a bridging portion and an opening of the FMM for evaporating the sub-pixel, a spacing between light-emitting regions of sub-pixels of the same color and the like. The above-mentioned design method may include: estimating sizes of sub-pixels of different colors according to a size of a pixel, a size of the PDL gap and the ratios of the opening rates of sub-pixels of different colors; observing whether a space is wasted or overlapped or not after drawing the first-edition arrangement by using CAD; adjusting the sizes of sub-pixels of different colors repeatedly to guarantee to a degree that the ratio of the opening rate is not changed; and after completing drawing, measuring parameters such as a size of the bridging portion and the like so as to ensure that demands can be met.

In study, an inventor of the present application finds that: the above-mentioned design method has many problems including that the opening rate ratio of the pixel is inaccurate, the opening rate is not maximized, a lot of time is consumed and other design problems may be generated in the adjustment process.

For example, light-emitting materials of sub-pixels of different colors are different in efficiency and service life, and thus, the sub-pixels of different colors also differ in light-emitting area and a certain ratio needs to be met. The opening rate of a sub-pixel of each color in the pixel arrangement obtained by estimation may not meet a ratio required by an OLED device, which is likely to cause defects of the overall display panel, such as color cast and the like.

For example, in a case where the pixel arrangement is designed, the area of the light-emitting region needs to be designed as big as possible, i.e., the opening of the sub-pixel occupies the overall sub-pixel region as much as possible, so as to ensure the service life of the device. However, the method for adjusting the size of the opening by manual estimation has poor accuracy, the opening rate of the obtained pixel arrangement is often not maximized and the panel space is wasted so as to directly influence the service life and the display effect of the OLED panel.

For example, in the pixel arrangement design, many variables should be considered and meanwhile, many constraints should be met. In order to meet design conditions, the above-mentioned processes, such as estimating, drawing and adjusting, all take a very long time. Moreover, whenever one variable is changed, assuming that the PDL gap or the opening rate ratio of sub-pixels of different colors is changed, all of the processes need to be restarted. Moreover, after a lot of time is spent, an optimal solution may still not be obtained, and a change tendency of the opening rate in with a certain variable also cannot be judged.

For example, in the process of the FMM, some limitation conditions (e.g., the size of the opening and the size of the bridging portion) should meet a certain range. Generally, the arrangement obtained by manually adjusting the size of each sub-pixel often cannot meet those limitation conditions, and thus can only be redesigned.

Embodiments of the present disclosure provide a display substrate, a fine metal mask set and a manufacturing method. The display substrate includes: a base substrate and a plurality of repeat units on the base substrate. Each repeat unit includes one first-color sub-pixel, one second-color sub-pixel pair and one third-color sub-pixel which are arranged in a first direction. The second-color sub-pixel pair includes two second-color sub-pixels arranged in a second direction. The plurality of repeat units are arranged in the first direction to form a plurality of repeat unit groups; the plurality of repeat unit groups are arranged in the second direction, and adjacent repeat unit groups in the plurality of repeat unit groups are staggered from each other in the first direction. Each sub-pixel includes a light-emitting layer, and light-emitting layers of adjacent sub-pixels of two different colors in the first direction are connected with each other; light-emitting layers of the third-color sub-pixel and the second-color sub-pixel which are adjacent to each other in the second direction are connected with each other; and a spacing is disposed between the light-emitting layer of the first-color sub-pixel and the light-emitting layer of at least one of the second-color sub-pixel and the third-color sub-pixel which are adjacent to the first-color sub-pixel in the second direction. In the display substrate provided by the embodiments of the present disclosure, an area of a light-emitting region of each sub-pixel can be increased to the greatest extent by design on a size of the light-emitting layer of sub-pixels of different colors.

The display substrate, the fine metal mask set and the manufacturing method provided by the embodiments of the present disclosure will be described below in connection of the drawings.

FIG. 1A is a partial structural schematic diagram of a display substrate provided by at least one embodiment of the present disclosure. As shown in FIG. 1A, the display substrate includes a base substrate 100 and a plurality of repeat units 200 positioned on the base substrate 100. Each repeat unit 200 includes one first-color sub-pixel 210, one second-color sub-pixel pair 220 and one third-color sub-pixel 230 which are arranged in a first direction (an X direction as shown in the drawing), the second-color sub-pixel pair 220 includes two second-color sub-pixels 2210 and 2220 arranged in a second direction (a Y direction as shown in the drawing, which is different from the first direction). The plurality of repeat units 200 are arranged in the first direction to form a plurality of repeat unit groups 2000, the plurality of repeat unit groups 2000 are arranged in the second direction, and adjacent repeat unit groups 2000 in the plurality of repeat unit groups 2000 are staggered mutually in the first direction, i.e., the adjacent repeat unit groups 2000 have a certain offset in the first direction, and thus, sub-pixels of the same color in the adjacent repeat unit groups 2000 are not aligned in the second direction. Pixel arrangement modes in the odd-numbered rows of repeat unit groups 2000 are the same, and pixel arrangement modes in the even-numbered rows of repeat unit groups 2000 are the same.

In some examples, the offset of the adjacent repeat unit groups 2000 in the first direction is half a size of the repeat unit 200 in the first direction. For example, the size of the repeat unit 200 in the first direction is a pitch of the repeat unit 200 in the first direction. The pitch herein means a distance between centers of light-emitting layers 211 of two first-color sub-pixels 210 respectively in adjacent two repeat units 200 along the first direction. Similarly, a distance between centers of light-emitting layers of two third-color sub-pixels respectively in adjacent two repeat units 200 along the first direction is the above-mentioned pitch, and a distance between centers of light-emitting layers of two second-color sub-pixel pairs respectively in adjacent two repeat unit along the first direction is the above-mentioned pitch.

The above-mentioned first direction and second direction respectively are two directions perpendicular to each other in the same plane. For example, the plane is a plane where pixels are arranged. The repeat unit herein merely means repeat of the sub-pixels, and other structures may be different and may also the same. Moreover, the above-mentioned repeat means approximate positions and shapes, and similar sizes. In some cases, in order to meet demands on wiring or opening, the shapes may be slightly different, and for example, there are openings at different positions.

As shown in FIG. 1A, four sub-pixels in each repeat unit 200 form two pixels, and the first-color sub-pixel 210 and the third-color sub-pixel 230 are respectively shared by two pixels. In the first direction, a sub-pixel density is 1.5 times of a pixel density, and in the second direction, a sub-pixel density is 1.5 times of a pixel density. With respect to a case that the sub-pixel density is twice of the pixel density in one direction and the sub-pixel density is one time of the pixel density in another direction, according to the embodiments of the present disclosure, the density of the sub-pixels is reduced and the numbers of the sub-pixels in two directions are balanced, so as to avoid a case in which the number of the sub-pixels is excessive in one direction. Therefore, when a pixel arrangement structure is applied to a display panel, the process difficulty of an FMM for producing the pixel in the display panel can be reduced overall. The first-color sub-pixel and the third-color sub-pixel in each pixel are shared by two pixels, so that the pixel in the embodiments of the present disclosure is not a pixel in the strict sense (i.e., one first-color sub-pixel, one second-color sub-pixel and one third-color sub-pixel define one pixel completely), and thus, the pixel in the present disclosure can be called as a virtual pixel.

As shown in FIG. 1A, each sub-pixel includes the light-emitting layer, and the light-emitting layers of adjacent sub-pixels of two different colors in the first direction are connected with each other. For example, in at least one repeat unit 200, the light-emitting layers of adjacent sub-pixels of two different colors are connected with each other. For example, in each repeat unit 200, the light-emitting layer 211 of the first-color sub-pixel 210 and a light-emitting layer 2211 (or 2221) of the second-color sub-pixel 2210 (or 2220) are connected with each other. The embodiments of the present disclosure describe by taking a case that the light-emitting layer 2211 of one second-color sub-pixel 2210 and the light-emitting layer 2221 of the other second-color sub-pixel 2220, which the second-color sub-pixel pair 220 includes, are integrated as an example, and for example, the light-emitting layers of two second-color sub-pixels of the second-color sub-pixel pair form one integral connected film layer, i.e., the light-emitting layers of the two second-color sub-pixels form one continuous complete pattern, and the light-emitting layers can be produced by one opening. But it is not limited thereto, and for example, the light-emitting layer 2211 of one second-color sub-pixel 2210 and the light-emitting layer 2221 of the other second-color sub-pixel 2220, which the second-color sub-pixel pair 220 includes, may also be separated (in FIG. 1A, a dotted line positioned between two light-emitting layers 2211 and 2221 schematically denotes that the two light-emitting layers 2211 and 2221 are separated), and at the moment, the light-emitting layers of sub-pixels having different colors from the second-color sub-pixel, which is adjacent to each second-color sub-pixel in the first direction, are all connected with the light-emitting layers of the two second-color sub-pixels. As shown in FIG. 1A, sub-pixels of two different colors adjacent to the second-color sub-pixel in the first direction are respectively positioned on both sides of the second-color sub-pixel in the first direction, i.e., respectively positioned on left and right sides of the second-color sub-pixel.

As shown in FIG. 1A, a light-emitting layer 231 of the third-color sub-pixel 230 and a light-emitting layer 2211 (or 2221) of the second-color sub-pixel 2210 (or 2220), which are adjacent to each other in the second direction, are connected. The adjacent repeat unit groups 2000 are staggered from each other in the first direction, and the sub-pixels adjacent to the second-color sub-pixel 2210 (or 2220) in the second direction include one third-color sub-pixel and one first-color sub-pixel, and thus, the sub-pixels adjacent to the second-color sub-pixel pair 220 in the second direction include two third-color sub-pixels 230 and two first-color sub-pixels 210. The word "adjacent" in the present application means that two sub-pixels are next to each other and there are no other sub-pixels between the two sub-pixels.

In the present disclosure, the connection of the light-emitting layers of sub-pixels of different colors means that boundaries of the light-emitting layers of sub-pixels of different colors are aligned in a direction perpendicular to the base substrate 100. The boundary of the light-emitting layer of a sub-pixel of each color herein means a position where a thickness of a practically produced light-emitting layer is about 50% of a specified thickness (e.g., a thickness of a middle portion of the light-emitting layer). The above-mentioned boundary of the light-emitting layer means a designed region for forming the light-emitting layer and does not include a shadow region diffused towards the periphery due to process reasons.

As shown in FIG. 1A, a spacing is disposed between the light-emitting layer of at least one of the second-color sub-pixel 2210 (or 2220) and the third-color sub-pixel 230 which are adjacent to the first-color sub-pixel 210 in the second direction and the light-emitting layer 211 of the first-color sub-pixel 210. That is, there is a spacing between the light-emitting layer of the second-color sub-pixel 2210 (or 2220) or the light-emitting layer of the third-color sub-pixel 230, which are adjacent to the first-color sub-pixel 210 in the second direction, and the light-emitting layer 211 of the first-color sub-pixel 210; or spacings are formed between the light-emitting layers of both the second-color sub-pixel 2210 (or 2220) and the third-color sub-pixel 230 which are adjacent to the first-color sub-pixel 210 in the second direction and the light-emitting layer 211 of the first-color sub-pixel 210. The above-mentioned case may be determined according to factors of a distance between two second-color sub-pixels in the second-color sub-pixel pair, the opening rate ratios of sub-pixels of different colors and the like in an actual process. An arrangement direction of the above-mentioned two sub-pixels adjacent to each other in the second direction may be a direction at a certain acute angle with the second direction, e.g., an inclined direction.

In the present disclosure, the case that the spacing is disposed between the light-emitting layers of sub-pixels of different colors means that there is a distance between boundaries of the light-emitting layers of adjacent sub-pixels of different colors, which are close to each other, and the light-emitting layers of adjacent sub-pixels of different colors are not in contact.

According to the embodiments of the present disclosure, the area of the light-emitting region of each sub-pixel can be increased as much as possible by design on the size of the light-emitting layer of a sub-pixel of each color so as to prolong the service life of a product.

For example, as shown in FIG. 1A, each of the first-color sub-pixel 210 and the third-color sub-pixel 230 includes a light-emitting region covering a center of the light-emitting layer and a non-light-emitting region surrounding the light-emitting region, i.e., the first-color sub-pixel 210 includes a first-color light-emitting region 212 covering the center of the light-emitting layer 211 of the first-color sub-pixel 210 and a non-light-emitting region 213 surrounding the first-color light-emitting region 212; and the third-color sub-pixel 230 includes a third-color light-emitting region 232 covering the light-emitting layer of the third-color sub-pixel 230 and a non-light-emitting region 233 surrounding the third-color light-emitting region 232. The second-color sub-pixel pair 220 includes two light-emitting regions 2212 and 2222 covering the light-emitting layer and a non-light-emitting region 2213 surrounding two light-emitting regions, and two light-emitting regions 2212 and 2222 are positioned on both sides of the center of the light-emitting layer in the second direction, i.e., the two light-emitting regions 2212 and 2222 are positioned on both sides of a first symmetry axis 2013 of the light-emitting layer, which extends in the first direction, and cover a second symmetry axis 2002 of the light-emitting layer, which extends in the second direction.

Figure 1B:
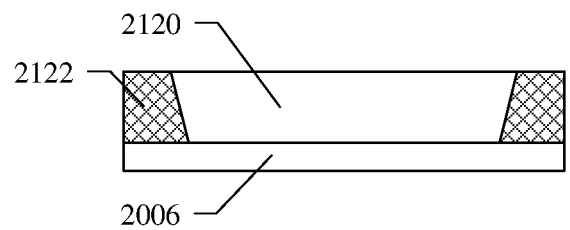
FIG. 1B is a partial structural schematic diagram of a pixel defining layer included in a sub-pixel of the display substrate as shown in FIG. 1A.

Each sub-pixel further includes an anode (an anode 2006 as shown in FIG. 1B) in contact with the light-emitting layer mutually, so that the light-emitting layer can be driven to emit light at a portion where the anode is in contact with the light-emitting layer mutually, and thus, the portion where the anode is in contact with the light-emitting layer mutually is an active portion of the sub-pixel, which can emit light, i.e., is the light-emitting region. The anode herein is used as a pixel electrode, so that different data voltages can be applied to different sub-pixels. However, according to the embodiments of the present disclosure, the electrode used as the pixel electrode of the sub-pixel is not limited to the anode, and a cathode of an OLED also can be used as the pixel electrode. Therefore, in the embodiments of the present disclosure, a shape of the light-emitting region of the sub-pixel may mean a shape of a portion where the pixel electrode and the light-emitting layer are in contact mutually. For example, for each sub-pixel, an area of the pixel electrode may be slightly greater than an area of the light-emitting layer, or the area of the light-emitting layer may be slightly greater than the area of the pixel electrode, and the embodiments of the present disclosure do not make any specific limit to it. For example, the light-emitting layer herein may include an electroluminescent layer and other functional layers positioned on both sides of the electroluminescent layer, e.g., a hole injection layer, a hole transport layer, an electron injection layer, an electron transport layer and the like.

FIG. 1B is a structural schematic diagram of a pixel defining layer (PDL) provided by an embodiment of the present disclosure. As shown in FIG. 1B, by taking the first-color sub-pixel 210 as an example, the first-color sub-pixel 210 further includes a PDL 2122, and the PDL 2122 includes an opening 2120 for defining the light-emitting region 212 of the first-color sub-pixel 210. The first-color sub-pixel 210 further includes the anode 2006, the anode 2006 and the light-emitting layer 211 completely overlap in the light-emitting region 212, and the anode 2006 is positioned on a side of the light-emitting layer 211 facing the base substrate. The shape of the light-emitting region of the sub-pixel can be defined by the PDL (as shown in FIG. 1B). For example, a lower electrode (for example, the anode) of the OLED may be arranged below the PDL, the PDL includes an opening for defining the sub-pixel, the opening exposes one part of the lower electrode, and in a case where the light-emitting layer is formed in the opening of the PDL, the light-emitting layer is in contact with the lower electrode, so that this part can drive the light-emitting layer to emit light. And thus, in this case, the opening of the PDL defines the shape of the light-emitting region of the sub-pixel.

For example, as shown in FIG. 1A, in at least one repeat unit 200 (for example, in each repeat unit 200), an area of the light-emitting region 232 of the third-color sub-pixel 230 is maximum, and an area of the light-emitting region of the second-color sub-pixel is minimum. Namely, the area of the light-emitting region 232 of the third-color sub-pixel 230 is greater than the area of the light-emitting region of the second-color sub-pixel and an area of the light-emitting region of the first-color sub-pixel 210. For example, the first-color sub-pixel 210 may be a red sub-pixel, the second-color sub-pixel 2210 (or 2220) may be a green sub-pixel, and the third-color sub-pixel 230 may be a blue sub-pixel. In the embodiments of the present disclosure, the areas of the light-emitting regions of sub-pixels of different colors are different in size, and because of the shortest service life of a material of the light-emitting layer of the blue sub-pixel, the area of the light-emitting region of the red sub-pixel is minimum, the area of the light-emitting region of the green sub-pixel is greater than the area of the light-emitting region of the red sub-pixel, and the area of the light-emitting region of the blue sub-pixel is maximum. The embodiments of the present disclosure are not limited to this, a service life of the light-emitting region of a sub-pixel of each color is decided according to the service life of the material, and the longer the service life of the material is, the smaller the area of the light-emitting region is.

For example, as shown in FIG. 1A, in at least one repeat unit 200, a size of the light-emitting region 232 of the third-color sub-pixel 230 in the first direction is maximum, a size of the light-emitting region 212 of the first-color sub-pixel 210 in the first direction is minimum, and a size of the light-emitting region of the second-color sub-pixel pair 220 in the first direction is between the size of the light-emitting region 232 and the size of the light-emitting region 212; and in at least one repeat unit 200, a size of the light-emitting region 212 of the first-color sub-pixel 210 and a size of the light-emitting region 232 of the third-color sub-pixel 230 in the second direction are approximately equal, a size of the light-emitting region 2212 (or 2222) of the second-color sub-pixel 2210 (or 2220) in the second direction is minimum, but the embodiments of the present disclosure are not limited thereto, a size relationship of the light-emitting regions of a sub-pixels of different colors in the first direction and the second direction can be determined according to a specific opening rate ratio relationship of sub-pixels of different colors. For example, in at least one repeat unit, the size of the light-emitting region of the first-color sub-pixel in the second direction may be slightly greater than the size of the light-emitting region of the third-color sub-pixel in the second direction. For example, in at least one repeat unit, the size of the light-emitting region of the second-color sub-pixel in the second direction may be roughly half the size of the light-emitting region of the first-color sub-pixel or the third-color sub-pixel in the second direction.

For example, the size of the light-emitting region 212 of the first-color sub-pixel 210 in the first direction is greater than 10 micrometers so as to prevent influence on evaporation because of a relatively small width of the light-emitting region 212 of the first-color sub-pixel 210.

For example, as shown in FIG. 1A, in each repeat unit 200, an orthogonal projection of one of the light-emitting layer 221 of the second-color sub-pixel pair 220 and the light-emitting layer 231 of the third-color sub-pixel 230 on the base substrate 100 has the maximum area, and an orthogonal projection of the light-emitting layer 211 of the first-color sub-pixel 210 on the base substrate 100 has the minimum area. According to characteristics of the material of the light-emitting layer and a spacing between two second-color sub-pixels included in the second-color sub-pixel pair, the orthogonal projection of the light-emitting layer of the green sub-pixel pair or the light-emitting layer of the blue sub-pixel on the base substrate has the maximum area, and the orthogonal projection of the light-emitting layer of the red sub-pixel on the base substrate has the minimum area.

For example, in at least one repeat unit 200, a size of the light-emitting layer 231 of the third-color sub-pixel 230 in the first direction is maximum, and a size of the light-emitting layer 211 of the first-color sub-pixel 210 in the first direction is minimum. In at least one repeat unit 200, a size of the light-emitting layer 221 of the second-color sub-pixel pair 220 in the second direction is maximum, and a size of the light-emitting layer 231 of the third-color sub-pixel 230 in the second direction is minimum. For example, in the second direction, a spacing between the light-emitting layer 231 of the third-color sub-pixel 230 and the light-emitting layer 211 of the first-color sub-pixel 210, which are adjacent to each other, is greater than a spacing between the light-emitting layer 2211 (or 2221) of the second-color sub-pixel 2210 (or 2220) and the light-emitting layer 211 of the first-color sub-pixel 210, which are adjacent to each other. However, the embodiments of the present disclosure are not limited to this, and it can be determined according to the specific opening rate ratio relationship of sub-pixels of respective colors.

For example, ratios of the sizes of the light-emitting layers of sub-pixels of different colors in the first direction to the sizes of the light-emitting layers of sub-pixels of different colors in the second directions are different.

For example, in a case that the opening rate ratio of the red sub-pixel (R), the green sub-pixel pair (G) and the blue sub-pixel (B) is 1:1.2:1.8, in the first direction, a size ratio of the light-emitting layer of the red sub-pixel, the light-emitting layer of the green sub-pixel pair and the light-emitting layer of the blue sub-pixel is 1:1.32:1.41, and in the second direction, a size ratio of the light-emitting layer of the red sub-pixel, the light-emitting layer of the green sub-pixel pair and the light-emitting layer of the blue sub-pixel is 1:0.97:0.91. For example, a ratio of the size of the light-emitting layer of the first-color sub-pixel (R) in the first direction to the size of the light-emitting layer of the first-color sub-pixel (R) in the second direction is 1, a ratio of the size of the light-emitting layer of the second-color sub-pixel pair (G) in the first direction to the size of the light-emitting layer of the second-color sub-pixel pair (G) in the second direction is 1.36, and a ratio of the size of the light-emitting layer of the third-color sub-pixel (B) in first direction to the size of the light-emitting layer of the third-color sub-pixel (B) in the second direction is 1.55.

For example, in a case that the opening rate ratio of the red sub-pixel (R), the green sub-pixel pair (G) and the blue sub-pixel (B) is 1:1.26:1.46, in the first direction, the size ratio of the light-emitting layer of the red sub-pixel, the light-emitting layer of the green sub-pixel pair and the light-emitting layer of the blue sub-pixel is 1:1.26:1.28, and in the second direction, the size ratio of the light-emitting layer of the red sub-pixel, the light-emitting layer of the green sub-pixel pair and the light-emitting layer of the blue sub-pixel is 1:1.08:0.92. For example, the ratio of the size of the light-emitting layer of the first-color sub-pixel (R) in the first direction to the size of the light-emitting layer of the first-color sub-pixel (R) in the second direction is 1, the ratio of the size of the light-emitting layer of the second-color sub-pixel pair (G) in the first direction to the size of the light-emitting layer of the second-color sub-pixel pair (G) in the second direction is 1.17, and the ratio of the size of the light-emitting layer of the third-color sub-pixel (B) in first direction to the size of the light-emitting layer of the third-color sub-pixel (B) in the second direction is 1.39.

For example, in a case that the opening rate ratio of the red sub-pixel (R), the green sub-pixel pair (G) and the blue sub-pixel (B) is 1:1.2:1.6, in the first direction, the size ratio of the light-emitting layer of the red sub-pixel, the light-emitting layer of the green sub-pixel pair and the light-emitting layer of the blue sub-pixel is 1:1.14:1.19, and in the second direction, the size ratio of the light-emitting layer of the red sub-pixel, the light-emitting layer of the green sub-pixel pair and the light-emitting layer of the blue sub-pixel is 1:1.22:1.02. For example, the ratio of the size of the light-emitting layer of the first-color sub-pixel (R) in the first direction to the size of the light-emitting layer of the first-color sub-pixel (R) in the second direction is 1, the ratio of the size of the light-emitting layer of the second-color sub-pixel pair (G) in the first direction to the size of the light-emitting layer of the second-color sub-pixel pair (G) in the second direction is 0.93, and the ratio of the size of the light-emitting layer of the third-color sub-pixel (B) in first direction to the size of the light-emitting layer of the third-color sub-pixel (B) in the second direction is 1.17.

The above-mentioned illustrated opening rate ratios may be applicable to products with different resolutions. The embodiments of the present disclosure exemplarily show the ratio of the sizes of the light-emitting layers of sub-pixels of different colors in the several opening rate ratio cases above, but are not limited to the ratio of the sizes of the light-emitting layers of sub-pixels of different colors in a case of a certain opening rate ratio. In the actual process, the factors of the size of the opening of the FMM for producing the sub-pixel, the size of the bridging portion and the like also should be considered.

For example, as shown in FIG. 1A, shapes of the light-emitting layer 211 of the first-color sub-pixel 210, the light-emitting layer 221 of the green sub-pixel pair 220 and the light-emitting layer 231 of the third-color sub-pixel 230 include a hexagon or an oval.

The shape of the light-emitting layer of each sub-pixel described in the embodiments of the present disclosure is a rough shape. In a case where the light-emitting layer is formed, it cannot be ensured that an edge of the sub-pixel is a strict straight line and a corner is of a strict angle shape. For example, the light-emitting layer can be formed by a mask in an evaporation process, and thus, the corner of the light-emitting layer can be of a rounded angle shape. Therefore, in a case where the FMM with the hexagonal opening is adopted to evaporate the light-emitting layer, the shape of the light-emitting layer may be of a hexagon shape, and also may be of an oval shape. Moreover, in some cases, metal etching may cause a draft angle, and thus, when the light-emitting layer of the sub-pixel is formed by utilizing the evaporation process, one corner of the light-emitting layer of the sub-pixel may be removed.

For example, as shown in FIG. 1A, the shape of the light-emitting layer of a sub-pixel of each color is the hexagon, the light-emitting layer 211 of the first-color sub-pixel 210 and the light-emitting layer 231 of the third-color sub-pixel 230 include edges parallel to the second direction, and a midpoint of the shortest connection line 2002 between edges which are away from each other in the first direction respectively in the light-emitting layer of the first-color sub-pixel 210 and the light-emitting layer of the third-color sub-pixel 230 which are adjacent to each other in the first direction and the center of the light-emitting layer 221 of the second-color sub-pixel pair 220 adjacent to the third-color sub-pixel 230 in the second direction are positioned on the same straight line 2003 parallel to the second direction. The center of the light-emitting layer herein means a geometric center of the shape of the light-emitting layer. Therefore, in the embodiments of the present disclosure, when a service life of the device is prolonged by increasing the size of the light-emitting layer of the third-color sub-pixel and reducing the size of the light-emitting layer of the first-color sub-pixel (i.e., in the first direction, a total size of the light-emitting layer of the first-color sub-pixel and the light-emitting layer of the third-color sub-pixel is unchanged, and boundaries of the light-emitting layer of the first-color sub-pixel and the light-emitting layer of the third-color sub-pixel are moved towards the first-color sub-pixel), it can be ensured that relative positions of the light-emitting layers of both the first-color sub-pixel and the third-color sub-pixel and the light-emitting layer of the second-color sub-pixel pair are unchanged so as to ensure compactness to the greatest extent.

For example, as shown in FIG. 1A, in the first direction, the sum of the sizes of the light-emitting layer 211 of the first-color sub-pixel 210 and the light-emitting layer 231 of the third-color sub-pixel 230 is roughly twice of the size of the light-emitting layer 221 of the second-color sub-pixel pair 220.

For example, as shown in FIG. 1A, shapes of the light-emitting region 212 of the first-color sub-pixel 210 and the light-emitting region 232 of the third-color sub-pixel 230 include the hexagon or the oval, and a shape of the light-emitting region 2212 (or 2222) of each second-color sub-pixel 2210 (or 2220) in the second-color sub-pixel pair 220 includes a pentagon, a circle or a waterdrop shape.

For example, as shown in FIG. 1A, both the light-emitting region 212 of the first-color sub-pixel 210 and the light-emitting region 232 of the third-color sub-pixel 230 are of a hexagon shape, opposite edges in each group of the hexagon are parallel to each other, and the light-emitting region 212 of the first-color sub-pixel 210 and the light-emitting region 232 of the third-color sub-pixel 230 include edges parallel to the second direction. The light-emitting region 2212 (or 2222) of each second-color sub-pixel 2210 (or 2220) is of a pentagon shape, the pentagon includes one group of parallel opposite edges (in parallel to the second direction) and one perpendicular edge (in parallel to the first direction), the perpendicular edge is perpendicular to the one group of parallel opposite edges, and two perpendicular edges in each second-color sub-pixel pair 220 are adjacent to each other.

Moreover, the shape of the light-emitting region of each sub-pixel in FIG. 1A includes a strict angle formed by two line segments, but in some embodiments, the shape of the light-emitting region of each sub-pixel may be a rounded angle pattern, such as a circle shape or a waterdrop shape. In another words, based on various pattern shapes above, the corner of the light-emitting region of each sub-pixel is rounded. For example, when the opening of the PDL is formed, a portion on a corner of the opening may form a rounded angle shape, so that the formed light-emitting region may be of a rounded angle shape.

For example, as shown in FIG. 1A, in the first-color sub-pixel 210 and the third-color sub-pixel 230, the non-light-emitting regions 213 and 233 positioned on the light-emitting layer are of an annular shape of which each position is approximately equal in width. In another words, in the first-color sub-pixel 210 and the third-color sub-pixel 230, a region of the light-emitting layer outside the region covered by the light-emitting region is of an annular shape with approximately equal widths everywhere. For example, the light-emitting layer 211 and the light-emitting region 212 of the first-color sub-pixel 210 are of a concentric hexagon shape, then the non-light-emitting region 213 of the first-color sub-pixel 210, which is positioned on the light-emitting layer 212, is of a hexagonal annular shape, and a width of each position of the hexagonal annular shape is Pg1. In another words, the shortest distance between the edge of the light-emitting layer 211 and the edge of the light-emitting region 212, which are parallel to each other, is Pg1. The embodiment is not limited to the case that the light-emitting layer 211 and the light-emitting region 212 of the first-color sub-pixel 210 are of the concentric hexagon shape, the light-emitting layer 211 and the light-emitting region 212 of the first-color sub-pixel 210 may also be of a concentric oval shape, then the non-light-emitting region 213 of the first-color sub-pixel 210 is of a circular annular shape, and a width of each position of the circular annular shape is Pg1. Similarly, a width of each position of the non-light-emitting region 213 of the third-color sub-pixel 230 is Pg3.

For example, as shown in FIG. 1A, in the non-light-emitting region 223 of the second-color sub-pixel pair 220, which is positioned on the light-emitting layer, a non-light-emitting region 2231 except a non-light-emitting region 2230 (a region shown by a dotted box in the drawing) between the mutually opposite edges of the light-emitting regions 2212 and 2222 of the two second-color sub-pixels 2210 and 2220 is of an annular shape with approximately equal widths everywhere, and a width of each position is Pg2. In another words, in the second-color sub-pixel pair, a region of the light-emitting layer except the portion covered by the light-emitting region and the portion between the mutually opposite edges of the light-emitting regions of the two second-color sub-pixels is of an annular shape of which each position is approximately equal in width.

For example, as shown in FIG. 1A, the widths of the annular-shaped non-light-emitting regions of sub-pixels of different colors are approximately equal to each other, i.e., Pg1=Pg2=Pg3. In the embodiments of the present disclosure, the widths of the annular-shaped non-light-emitting regions of sub-pixels of different colors are set to be equal, so that influence on evaporation of sub-pixels of different colors, which is generated when the FMM is adopted to evaporate and the FMM is shifted, can be reduced.

For example, as shown in FIG. 1A, in each repeat unit 200, the shortest distance between edges of the light-emitting regions of adjacent sub-pixels of two different colors is in a range of 15 to 30 micrometers, i.e., the sum of Pg1 and Pg2 is in a range of 15 to 30 micrometers, the sum of Pg2 and Pg3 is in a range of 15 to 30 micrometers, and the sum of Pg1 and Pg3 is in a range of 15 to 30 micrometers. The above-mentioned shortest distance between the edges of the light-emitting regions of adjacent sub-pixels of two different colors means the shortest distance between edges, which are close to each other, of the light-emitting regions respectively of adjacent sub-pixels of two different colors.

For example, as shown in FIG. 1A, in another example of the embodiments of the present disclosure, the shape of the non-light-emitting region 213 of the first-color sub-pixel 210, which is positioned on the light-emitting layer, is not limited to the annular shape of which each position is approximately equal in width. For example, the width Pg1 of the annular shape in the first direction (the X direction) is smaller than a width Pg10 of the annular shape in a third direction, and the third direction is parallel to the shortest connection line 2001 between the mutually opposite edges of the light-emitting region 212 of the first-color sub-pixel 210 and the light-emitting region of the second-color sub-pixel, which are adjacent to each other in the second direction. By increasing a size of a portion, which is close to the second-color sub-pixel, of the light-emitting layer of the first-color sub-pixel in the process of evaporating the first-color sub-pixel and the second-color sub-pixel, even though the FMM for evaporating the light-emitting layers of sub-pixels of the two colors is shifted, influence on the light-emitting regions of sub-pixels of the two colors also can be reduced, and for example, the light-emitting layer of the first-color sub-pixel can be prevented from being evaporated into the light-emitting region of the second-color sub-pixel.

For example, a midpoint of the shortest connection line 2001 between the mutually opposite edges of the light-emitting region 212 of the first-color sub-pixel 210 and the light-emitting region 2212 (or 2222) of the second-color sub-pixel 2210 (2220), which are adjacent to each other in the second direction, is positioned at the edge of the light-emitting layer 211 of the first-color sub-pixel 210, so that the area of the light-emitting region 212 of the first-color sub-pixel 210 also can be maximized.

For example, in the second-color sub-pixel pair 220 adjacent to the first-color sub-pixel in the second direction, the midpoint of the shortest connection line 2001 between a boundary of the light-emitting region, which is close to the first-color sub-pixel 210, of the second-color sub-pixel and a boundary of the light-emitting region of the first-color sub-pixel 210 is positioned at the edge of the light-emitting layer 211 of the first-color sub-pixel 210.

For example, the shortest distance between the edges of the light-emitting regions of adjacent sub-pixels of two different colors in each repeat unit 200 is in a range of 20 to 25 micrometers.

For example, the width of each annular-shaped non-light-emitting region may be in a range of 7 to 15 micrometers.

For example, the width of each annular-shaped non-light-emitting region may be in a range of 10 to 12 micrometers.

For example, the above-mentioned display substrate can be applied to devices, such as an OLED display apparatus and the like, and any product or part with a display function, which includes the display apparatus, such as a television, a digital camera, a mobile phone, a watch, a tablet personal computer, a notebook computer, a navigator and the like, and the embodiments are not limited thereto.

Figure 2A:
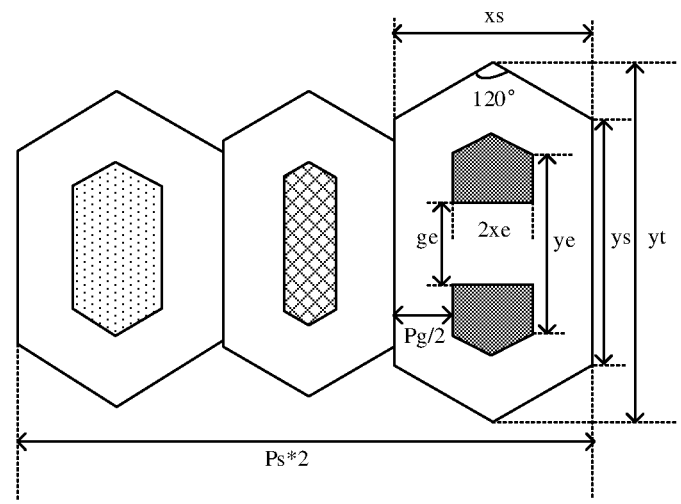
FIG. 2A is a geometric model of a size of a sub-pixel of each color, as provided by an embodiment of the present disclosure.

FIG. 2A is a geometric model of a size of a sub-pixel of each color, as provided by an embodiment of the present disclosure. In order to achieve maximization of the opening rate of a sub-pixel of each color and high accuracy of the opening rate ratio of sub-pixels of different colors in a case of short spend time, the embodiment of the present disclosure establishes the geometric model for pixel arrangement characteristics and geometric characteristics as shown in FIG. 1A. As shown in FIG. 2A, by taking a case that the second-color sub-pixel is a green sub-pixel (G), the first-color sub-pixel is a red sub-pixel (R), the third-color sub-pixel is a blue sub-pixel (B) and the light-emitting layer of a sub-pixel of each color is of a hexagon shape with a vertex angle of 120 degrees as an example, it is set that the area of the light-emitting region is se, the opening rate is ar, and the opening rate ratio of the red sub-pixel, the green sub-pixel and the blue sub-pixel is 1:aaG:aaB. The size of the light-emitting region in the first direction is 2xe, a size of the edge of the light-emitting region in the second direction is (ye−ge), the width of the annular-shaped non-light-emitting region is pg/2, the size of the light-emitting layer in the first direction is xs, the size of the light-emitting layer in the second direction is yt, a size of the edge of the light-emitting layer, which extends in the second direction, is ys, a size of the repeat unit in the first direction is 2ps, a size of the repeat unit in the second direction is ps, and ps is a pixel size. In the geometric model below, corresponding to different parameters of sub-pixels of different colors, it is distinguished by letters R, G and B.

For example, a relational expression of the geometric model of the red sub-pixel (R) includes:

$xeR=xeR$ $yeR=yeR$ $seR=2xeR \cdot xeR \cdot \tan 30 + yeR \cdot 2xeR \cdot geR$ $xsR=pg+2xeR$ $ysR=yeR+pg \cdot \tan 30$ $ytR=yeR+2xeR/\tan 60+pg/\sin 60$ $arR=seR/2ps^2$ \hfill (1)

xeR and yeR included in the relationship expression (1) are unknown variables, pg can be the size of the PDL, which can be used as a known quantity, geR=0, and ps can be the pixel size which can be used as a known quantity.

For example, a relational expression of the geometric model of the blue sub-pixel (B) includes:

$xeB=xeB$ $yeB=(seB+2xeB*geB)/2xeB-xeB/\tan 60$ $seB=seR*aaB$ $xsB=pg+2xeB$ $ysB=yeB+pg \cdot \tan 30$ $ytB=yeB+2xeB/\tan 60+pg/\sin 60$ $arB=seB/2ps^2$ \hfill (2)

xeB included in the relationship expression (2) is an unknown variable, geB=0, and yeB and seB can be deduced from a relationship of the red sub-pixel and the blue sub-pixel.

For example, a relationship expression of the geometric model of the green sub-pixel (G) includes:

$xeG=(xsG\cdot pg)/2$ $yeG=(seG+2xeG*geG)/2xeG-xeG/\tan 60$ $seG=seR*aaG$ $xsG=2ps-xsR-xsB$ $ysG=yeG+pg\cdot\tan 30$ $ytG=yeG+2xeG/\tan 60+pg/\sin 60$ $arG=seG/2ps^2$ (3)

xsG, yeG and seG included in the relationship expression (3) can be deduced from a relationship of the green sub-pixel and the red sub-pixel as well as the blue sub-pixel.

Figure 2B:
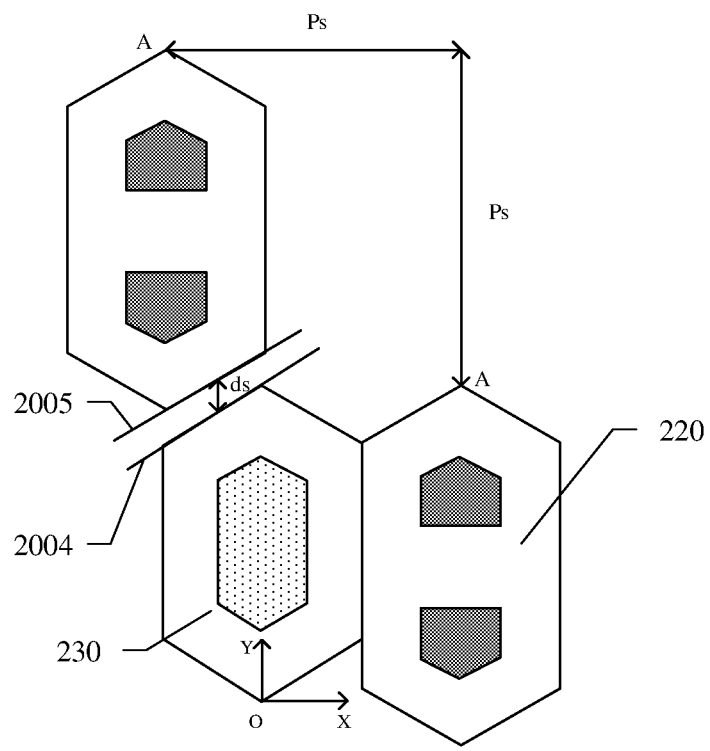
FIG. 2B is a schematic diagram of a constraint relationship satisfied by parameters in the geometric model as shown in FIG. 2A.

FIG. 2B is a schematic diagram of a constraint relationship satisfied by parameters in the geometric model as shown in FIG. 2A. As shown in FIG. 2B, distances of two upper end points A and A respectively of the light-emitting layers of two green sub-pixel pairs in the repeat units which are positioned in the adjacent repeat unit groups and adjacent to each other in the first direction and the second direction are both ps. An arrow pointing direction of a Y direction is taken as up, and a direction opposite to the arrow pointing direction of the Y direction is taken as down herein. Similarly, sub-pixels of other colors also meet this relationship. For example, a coordinate system is constructed by taking a lower end point of the blue sub-pixel 230 as a coordinate system origin O, a linear equation y1 of a first straight line 2004 coinciding with one edge of the light-emitting layer of the blue sub-pixel 230 is established, a linear equation y2 of a second straight line 2005 coinciding with one edge of the light-emitting layer, which is close to the blue sub-pixel 230, of the green sub-pixel pair 220 adjacent to the blue sub-pixel 230 in the second direction is established, and under the same abscissa, a constraint condition of $-\cot 60*(xsB+xsR-2ps)/2+(ytB-ytR+2ps)/2 \geq ytB$ is obtained according to $y2-y1=ds\geq 0$. Similarly, another two constraint conditions of $-\cot 60*(xsR+xsG-2ps)/2+(ytR-ytG+2ps)/2 \geq ytR$ and $-\cot 60*(xsG+xsB-2ps)/2+(ytG-ytB+2ps)/2 \geq ytG$ can be obtained. The three constraint conditions above constitute a first group of constraint conditions which sub-pixels of different colors should meet.

Figure 2C:
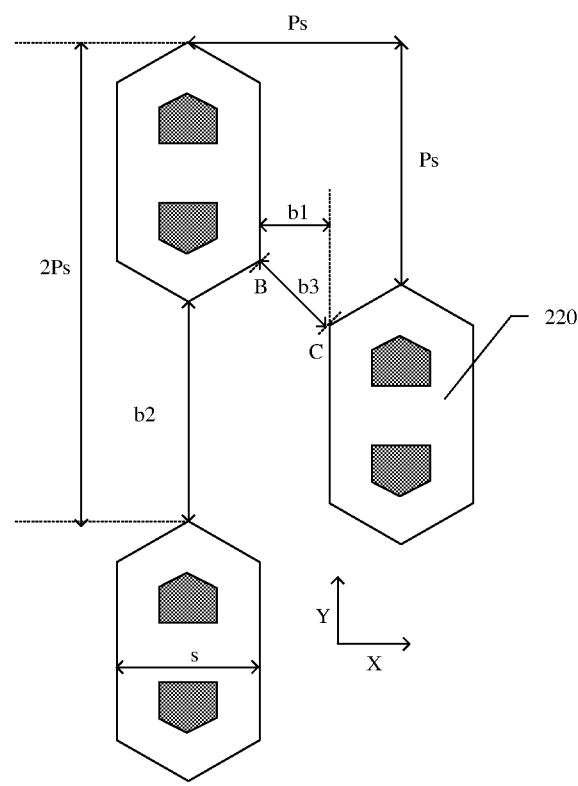
FIG. 2C is a schematic diagram of another constraint relationship satisfied by parameters in the geometric model as shown in FIG. 2A.

FIG. 2C is a schematic diagram of another constraint relationship satisfied by the parameters in the geometric model as shown in FIG. 2A, and FIG. 2C describes by taking the green sub-pixel pair 220 as an example. As shown in FIG. 2C, a distance between the light-emitting layers of two green sub-pixel pairs 220 in two adjacent repeat units respectively positioned in two adjacent repeat unit groups in the first direction meets a constraint condition of $d1=ps-xsG\geq rib1$. Similarly, another two constraint conditions of $ps-xsB\geq rib1$ and $ps-xsR\geq rib1$, which sub-pixels of different colors meet, can be obtained. Corresponding to sub-pixels of different colors, values of rib1 are different herein, and rib2, rib3 and slot below all refer to corresponding values to sub-pixels of different colors. The three constraint conditions above constitute a second group of constraint conditions which sub-pixels of different colors should meet.

As shown in FIG. 2C, a distance between the light-emitting layers of two green sub-pixel pairs 220 respectively in two adjacent repeat units positioned in two adjacent repeat unit groups in the second direction meets a constraint condition of $d2=2ps-ytG\geq rib2$. Similarly, another two constraint conditions of $2ps-ytB\geq rib2$ and $2ps-ytR\geq rib2$, which sub-pixels of different colors meet, can be obtained. The three constraint conditions above constitute a third group of constraint conditions which sub-pixels of different colors should meet.

As shown in FIG. 2C, a distance between two end points B and C of the light-emitting layers of two green sub-pixel pairs 220 in two adjacent repeat units respectively positioned in two adjacent repeat unit groups meets a constraint condition of $d3=((ps-ysG)^2+(ps-2xeG-pg)^2)^{1/2}\geq rib3$. Similarly, another two constraint conditions of $((ps-ysB)^2+(ps-2xeB-pg)^2)^{1/2}\geq rib3$ and $((ps-ysR)^2+(ps-2xeR-pg)^2)^{1/2}\geq rib3$, which sub-pixels of different colors meet, can be obtained. The three constraint conditions above constitute a fourth group of constraint conditions which sub-pixels of different colors should meet.

The parameters of rib1 to rib3 shown in FIG. 2C are minimum sizes of the bridging portions of the FMM for producing sub-pixels of the same color, and because of reasons of process limitations of a manufacturer and the like, the minimum size of the bridging portion of the FMM is rib, so that the distances between the light-emitting layers of sub-pixels of the same color cannot be smaller than rib.

For example, the minimum size rib of the bridging portion of the FMM is not smaller than a range of 10 to 20 micrometers.

As shown in FIG. 2C, a minimum size of the opening of the FMM for a sub-pixel of each color in the first direction is slot, and then the size of the light-emitting layer of a sub-pixel of each color in the first direction cannot be smaller than slot, so as to obtain a fifth group of constraint conditions: $xsR\geq slot$, $xsG\geq slot$ and $xsB\geq slot$. For example, the minimum size slot is 25 micrometers.

According to the above-mentioned geometric relationship expression of a sub-pixel of each color and the five groups of constraint conditions that are satisfied, maximization of the opening rate of a sub-pixel of each color and high accuracy of the opening rate ratio of sub-pixels of different colors can be achieved at the cost of short time. In order to further save time, an optimal solution which achieves maximization of the opening rate and meets the constraint conditions can be obtained by utilizing an iterative algorithm. However, the embodiments of the present disclosure are not limited to adoption of the iterative algorithm, also can adopt other algorithms to calculate.

Figure 3:
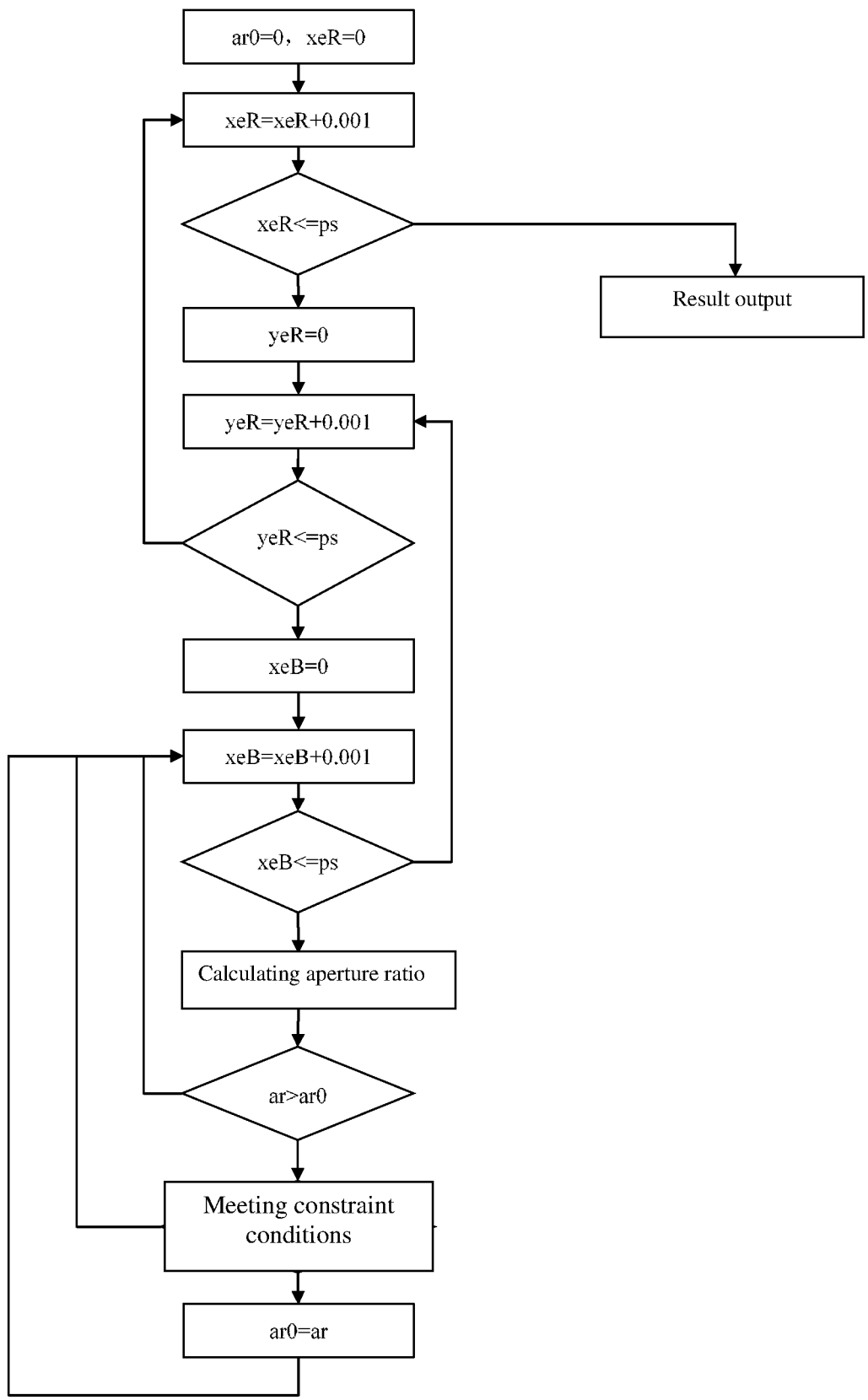
FIG. 3 is a flow chart for calculating an optimal solution, as provided by an embodiment of the present disclosure.

FIG. 3 is a flow chart for calculating an optimal solution, as provided by an embodiment of the present disclosure. As shown in FIG. 3, 0 is input to an unknown variable xeR, an initial opening rate ar0 is set as 0, then xeR is added with 0.01 and a relationship between xeR and the pixel size ps is judged. If ps≥xeR, 0 is input to an unknown variable yeR, and if ps<xeR, calculation is ended. In the case that ps≥xeR, yeR is added with 0.01 and a relationship between yeR and the pixel size ps is judged. If ps≥yeR, 0 is input to the unknown variable xeB, and if ps<yeR, it proceeds to the step in which xeR=xeR+0.01 and calculation is continued. In the case that psps≥yeR, xeB is added with 0.01 and a relationship between xeB and the pixel size ps is judged. If ps≥xeB, a total opening rate ar is calculated, and if ps<xeB, it proceeds to the step in which yeR=yeR+0.01 and calculation is continued. In the case that ps≥xeB, the opening rate ar is compared to the initial opening rate ar0, if ar>ar0, it is calculated whether each parameter of the geometric model obtained by the geometric relationship shown in FIG. 2A meets the above-mentioned five groups of constraint conditions, and if ar0≥ar, it proceeds to the step in which xeB=xeB+0.01 and calculation is continued. In a case that the constraint conditions are met, ar0 is set as ar and current ar0 is saved, and if the constraint conditions are not met, it proceeds to the step in which xeB=xeB+0.01 and calculation is continued. An optimal solution of each parameter in the geometric model in a case of the maximum opening rate ar can be obtained by the above-mentioned cycle calculation. In the above-mentioned step of adding 0.01 to xeR, yeR or xeB, it is not limited to the added value of 0.01, the added value also may be 0.01 or 0.001 and the like, and it is determined according to design accuracy and production accuracy. For example, this value can be used as a step length variable and is set first in the initial stage of a program.

The above-mentioned opening rate ar is the sum of the opening rate of sub-pixels of different colors in the above-mentioned geometric model, i.e., ar=arR+arG+arB.

Figure 4A:
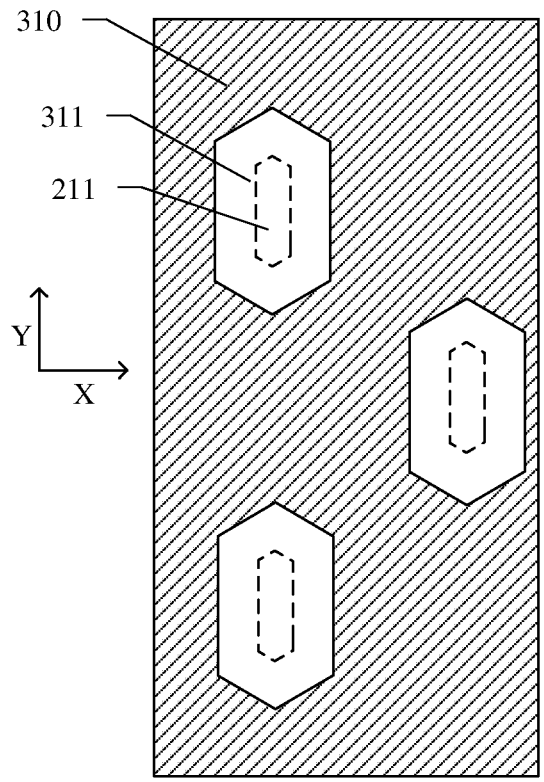
FIG. 4A to FIG. 4C are structural schematic diagrams of a fine metal mask set provided by another embodiment of the present disclosure.
Figure 4B:
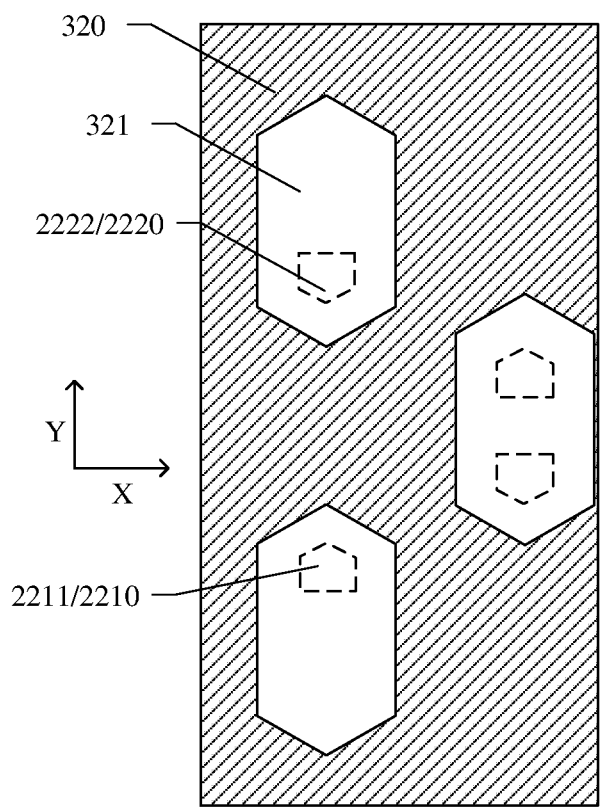
Figure 4C:
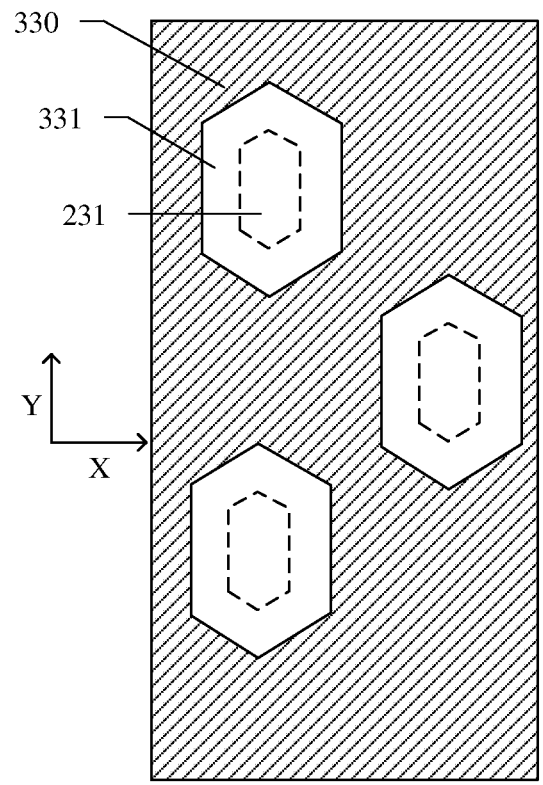

Another embodiment of the present disclosure provides an FMM set for evaporating the above-mentioned display substrate, and FIG. 4A to FIG. 4C are structural schematic diagrams of the FMM set provided by the embodiment of the present disclosure. As shown in FIG. 4A to FIG. 4C, the FMM set includes: a first mask 310, a second mask 320 and a third mask 330. The first mask 310 includes a plurality of first openings 311, and each first opening 311 is used for forming the light-emitting layer 211 of the first-color sub-pixel 210 as shown in FIG. 1A. The second mask 320 includes a plurality of second openings 321, and each second opening 321 is used for simultaneously forming the light-emitting layers 221 of the two second-color sub-pixels 2210 and 2220 included in the second-color sub-pixel pair 220 as shown in FIG. 1A. The third mask 330 includes a plurality of third openings 331, and each third opening 331 is used for forming the light-emitting layer 231 of the third-color sub-pixel 230 as shown in FIG. 1A.

For example, as shown in FIG. 1A and FIGS. 4A to 4C, a shape of the first opening 311 is approximately the same as the shape of the light-emitting layer 211 of the first-color sub-pixel 210; a shape of the second opening 320 is approximately the same as the shape of the light-emitting layer 221 of the second-color sub-pixel pair 220; and a shape of the third opening 331 is approximately the same as the shape of the light-emitting layer 231 of the third-color sub-pixel 230.

For example, as shown in FIG. 4A to FIG. 4C, the shortest distance between two adjacent first openings 311 is not smaller than a range of 10 to 20 micrometers, i.e., a size of a bridging portion of the first mask 310 except the first opening 311 is not smaller than a range of 10 to 20 micrometers. Similarly, the shortest distance between two adjacent second openings 321 is not smaller than a range of 10 to 20 micrometers, and the shortest distance between two adjacent third openings 331 is not smaller than a range of 10 to 20 micrometers.

As shown in FIG. 1A and FIGS. 4A to 4C, two openings for evaporating the light-emitting layers of adjacent sub-pixels of two different colors in each repeat unit group 2000 are configured to have orthogonal projections on the display substrate, of which boundaries are connected, so that in at least one repeat unit 200, the boundaries of the light-emitting layers of adjacent sub-pixels of two different colors, which are evaporated through the openings, are connected with each other. The third opening 311 and the second opening 321 which are respectively used for evaporating the light-emitting layer 231 of the third-color sub-pixel 230 and the light-emitting layer 221 of the second-color sub-pixel pair 220 which are adjacent to each other in the second direction are configured to have orthogonal projections on the display substrate, which are connected, so that the light-emitting layer 231 of the third-color sub-pixel 230 and the light-emitting layer 221 of the second-color sub-pixel pair 220 which are adjacent to each other in the second direction are connected. The first opening 311 for evaporating the light-emitting layer 211 of the first-color sub-pixel 210 and at least one of the second opening 321 for evaporating the light-emitting layer 221 of the second-color sub-pixel pair 220 adjacent to the first-color sub-pixel 210 in the second direction and the third opening 331 for evaporating the light-emitting layer 231 of the third-color sub-pixel 230 adjacent to the first-color sub-pixel 210 in the second direction are configured to have orthogonal projections on the display substrate, which are spaced, so that there is a spacing between the light-emitting layer of at least one of the second-color sub-pixel and the third-color sub-pixel 230 which are adjacent to the first-color sub-pixel 210 in the second direction and the light-emitting layer 211 of the first-color sub-pixel 210.

For example, as shown in FIG. 4A to FIG. 4C, a case that the first mask 310 is used for evaporating the red sub-pixel, the second mask 320 is used for evaporating the green sub-pixel pair and the third mask 330 is used for evaporating the blue sub-pixel is taken as an example.

For example, in the case that the opening rate ratio of the red sub-pixel (R), the green sub-pixel pair (G) and the blue sub-pixel (B) is 1:1.2:1.8, the first opening 311 for evaporating the red sub-pixel has a size of 34.2 micrometers in the X direction and a size of 78.4 micrometers in the Y direction; the second opening 321 for evaporating the green sub-pixel pair has a size of 45.3 micrometers in the X direction and a size of 76.29 micrometers in the Y direction; and the third opening 331 for evaporating the blue sub-pixel has a size of 48.1 micrometers in the X direction and a size of 71.05 micrometers in the Y direction. The above-mentioned opening sizes may be applicable to evaporation on a sub-pixel of a display substrate of a Full High Definition (FHD) display, and a PPI of the display is 398.

For example, in the case that the opening rate ratio of the red sub-pixel (R), the green sub-pixel pair (G) and the blue sub-pixel (B) is 1:1.26:1.46, the first opening 311 for evaporating the red sub-pixel has the size of 34.5 micrometers in the X direction and the size of 70.92 micrometers in the Y direction; the second opening 321 for evaporating the green sub-pixel pair has the size of 43.5 micrometers in the X direction and the size of 76.48 micrometers in the Y direction; and the third opening 331 for evaporating the blue sub-pixel has the size of 44 micrometers in the X direction and the size of 65.43 micrometers in the Y direction. The above-mentioned opening sizes may be applicable to evaporation on the sub-pixel of the display substrate of the FHD display, and the PPI of the display is 416.

For example, in the case that the opening rate ratio of the red sub-pixel (R), the green sub-pixel pair (G) and the blue sub-pixel (B) is 1:1.2:1.6, the first opening 311 for evaporating the red sub-pixel has the size of in 28.32 micrometers the X direction and the size of 49.57 micrometers in the Y direction; the second opening 321 for evaporating the green sub-pixel pair has the size of 32.36 micrometers in the X direction and the size of 60.28 micrometers in the Y direction; and the third opening 331 for evaporating the blue sub-pixel has the size of 33.82 micrometers in the X direction and the size of 50.58 micrometers in the Y direction. The above-mentioned opening sizes may be applicable to evaporation on a sub-pixel of a display substrate of a Quarter High Definition (QHD) display, and a PPI of the display is 538.

The illustrated opening sizes for evaporating sub-pixels of different colors are just schematic, the above-mentioned various opening sizes may be changed due to influence of many factors, and the embodiments of the present disclosure do not make any limit herein.

Figure 5A:
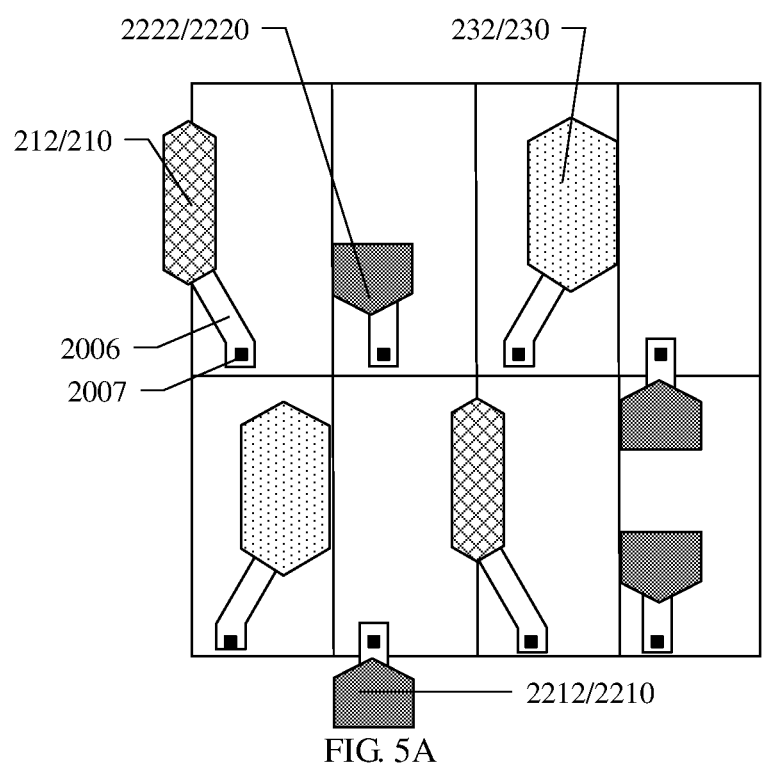
FIG. 5A is a structural schematic diagram of partial sub-pixel arrangement, as provided by an embodiment of the present disclosure.
Figure 5B:
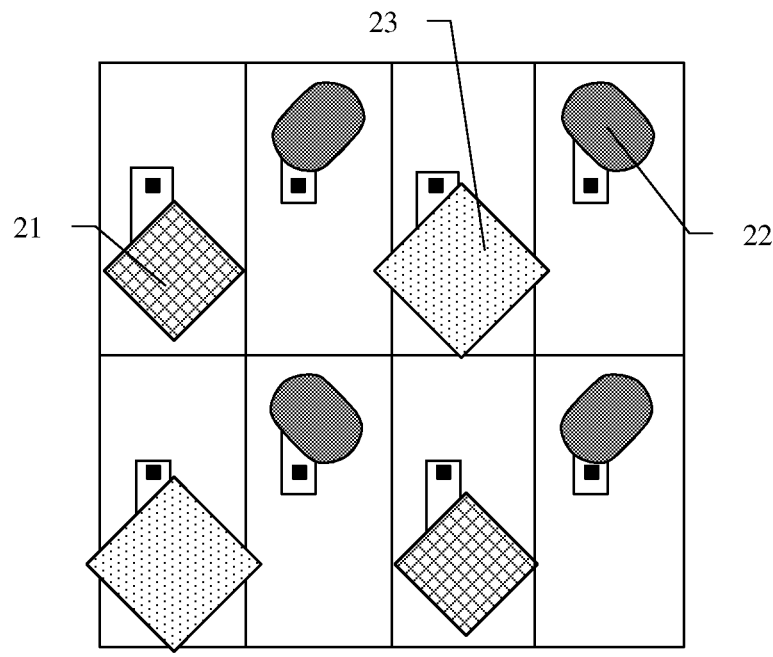
FIG. 5B is a schematic diagram of a diamond-shaped pixel arrangement.

FIG. 5A is a structural schematic diagram of partial sub-pixel arrangement, as provided by an embodiment of the present disclosure, and FIG. 5B is a schematic diagram of diamond-shaped pixel arrangement. As shown in FIG. 5A, a sub-pixel of each color further includes an anode and a cathode positioned on both sides of a light-emitting layer in a direction perpendicular to a base substrate, and FIG. 5A schematically shows the anode 2006. As shown in FIG. 5A, four sub-pixels positioned on a first row include one first-color sub-pixel 210, two second-color sub-pixels 2210 and 2220 and one third-color sub-pixel 230, the four sub-pixels form two pixels, and similarly, four sub-pixels positioned on a second row form two pixels. FIG. 5A schematically shows shapes and relative positions of light-emitting regions of sub-pixels of different colors, and the anode 2006 of each sub-pixel is connected with a thin film transistor through a via hole 2007 so as to drive the light-emitting layer to emit light.

For example, as shown in FIG. 5B, in the diamond-shaped pixel arrangement, four sub-pixels positioned on a first row also include one first-color sub-pixel 21, two second-color sub-pixels 22 and one third-color sub-pixel 23, and the four sub-pixels form two pixels. Similarly, four sub-pixels positioned on a second row form two pixels. FIG. 5B schematically shows shapes and relative positions of light-emitting regions of sub-pixels of different colors, and an anode of each sub-pixel is connected with a thin film transistor by a via hole so as to drive a light-emitting layer to emit light. Each second-color sub-pixel in the diamond-shaped pixel arrangement needs to be evaporated by an independent FMM, i.e., different second-color sub-pixels need to be evaporated by different openings.

In a case that a size of a PDL of a pixel arrangement structure provided by an embodiment of the present disclosure and a size of a PDL of a diamond-shaped pixel arrangement structure as shown in FIG. 5B are designed to be the same, a size relationship of opening rates of the two structures when the two pixel arrangement structures are applied to products with different resolutions is compared.

For example, when both the two structures are applied to an FHD display with a 400 PPI resolution and the sizes of the PDLs are both about 22 to 24 micrometers, the opening rate of the pixel arrangement structure provided by the embodiments of the present disclosure is greater than the opening rate of the diamond-shaped pixel arrangement structure by 3.8% to 7.9%.

For example, when both the two structures are applied to a QHD display with a 500 PPI resolution and the sizes of the PDLs are both about 18 to 20 micrometers, the opening rate of the pixel arrangement structure provided by the embodiments of the present disclosure is greater than the opening rate of the diamond-shaped pixel arrangement structure by 0.9% to 4.3%.

For example, when both the two structures are applied to an Ultra High Definition (UHD) display with a 600 PPI resolution and the sizes of the PDLs are both about 14 to 16 micrometers, the opening rate of the pixel arrangement structure provided by the embodiments of the present disclosure is greater than the opening rate of the diamond-shaped pixel arrangement structure by 6.5% to 15.4%.

Therefore, it can be seen that in displays with different resolutions, the opening rate of the pixel arrangement structure provided by the embodiments of the present disclosure is higher than the opening rate of the diamond-shaped pixel arrangement structure, and it is more obvious in the UHD display with the 600 PPI resolution. The higher the opening rate is, the longer the service life of the display is, and thus, the display using the pixel arrangement structure provided by the embodiments of the present disclosure has a longer service life.

Figure 5C:
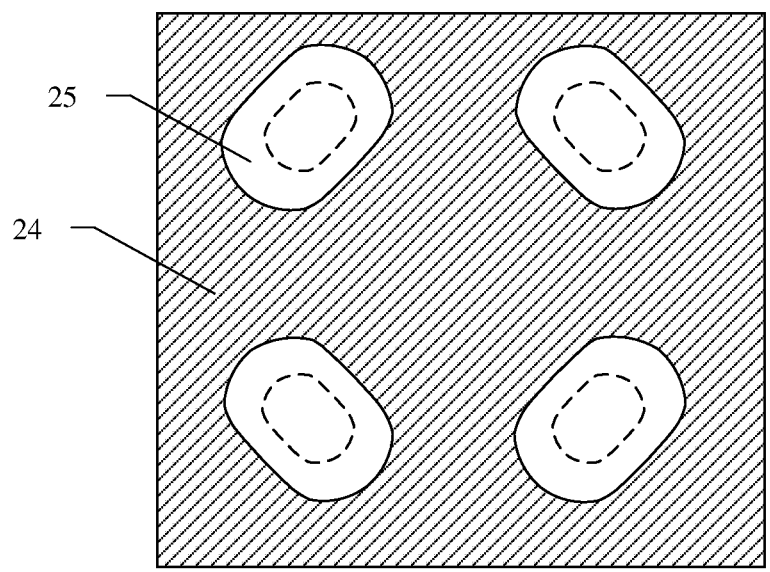
FIG. 5C is a schematic diagram of a mask for evaporating a second-color sub-pixel as shown in FIG. 5B.

FIG. 5C a schematic diagram of a mask for evaporating the second-color sub-pixel as shown in FIG. 5B. As shown in FIG. 5C, the mask 24 includes an opening 25 for evaporating the second-color sub-pixel 22 as shown in FIG. 5B, and a dotted box in the opening 25 represents the light-emitting region of the second-color sub-pixel 22.

For the second mask (as shown in FIG. 4B) for evaporating the second-color sub-pixel, which is provided by the embodiments of the present disclosure, compared to the pixel arrangement structure and the mask as shown in FIG. 5B and FIG. 5C, according to the embodiments of the present disclosure, two green sub-pixels are adjacently arranged as a pair. When the light-emitting layer is prepared by using an FMM evaporation process, the light-emitting layers of the two green sub-pixels in each pair can be connected, and the green light-emitting layers of the two green sub-pixels in each pair are formed by one opening of the FMM, so that the process difficulty in preparation of the light-emitting layer of the green sub-pixel is reduced to a certain degree. By using one opening of the FMM for forming one second-color sub-pixel pair, the difficulty in production of the FMM can be reduced; and a distance between adjacent two openings in the FMM can be designed to be large, and thus, strength of the FMM can be promoted, so that not only can production yield of the FMM be promoted, but also purchase cost can be reduced.

In the actual production process of the FMM, metal etching may cause the draft angle, and thus, when sub-pixels of different colors are prepared by using the FMM evaporation process, the shape of the formed sub-pixel may be not a standard hexagon (standard hexagon is shown in FIG. 4A to FIG. 4C), and for example, may be a shape of which an angle is removed and the like.

Figure 6A:
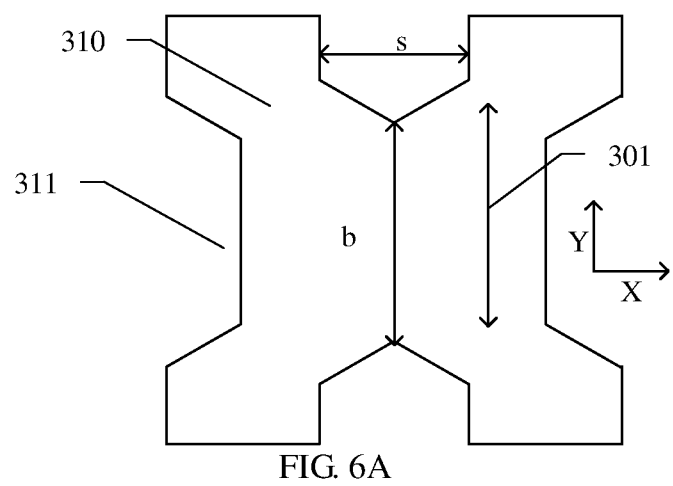
FIG. 6A is a partial structural schematic diagram of a first mask in an embodiment of the present disclosure.
Figure 6B:
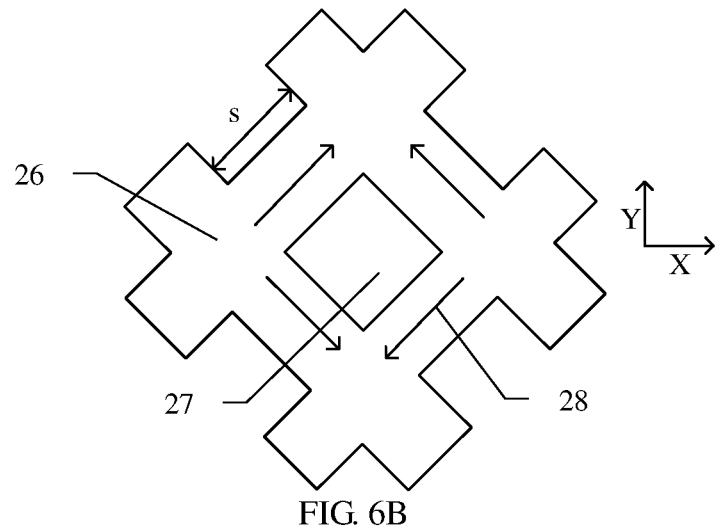
FIG. 6B is a partial structural schematic diagram of a mask for evaporating a first-color sub-pixel in a diamond-shaped pixel arrangement structure as shown in FIG. 5B.

FIG. 6A is a partial structural schematic diagram of a first mask in an embodiment of the present disclosure, and FIG. 6B is a partial structural schematic diagram of a mask for evaporating the first-color sub-pixel in the diamond-shaped pixel arrangement structure as shown in FIG. 5B. As shown in FIG. 6A, the first mask 310 includes a bridging portion rib except the first opening 311, and the bridging portion rib is used for bearing an acted tensile force. When a tensile force in a Y direction is applied to the first mask 310 as shown in FIG. 6A, a transfer direction of a tensile force 301 in the bridging portion rib is still the Y direction, and thus, consistency between a stress state of the bridging portion of the mask and a direction of screen stretching tensile force is higher and the mask is difficult to generate wrinkles, so as to make evaporation more stable and benefit for improving evaporation accuracy.

When the tensile force in the Y direction is also applied to the mask as shown in FIG. 6B, because of limitation to a position of an opening 27 in the mask and an extension direction of a bridging portion 26 except the opening 27, a transfer direction of a tensile force in the bridging portion 26 may have a certain angle (the transfer force of the tensile force as shown in FIG. 6B) with the Y direction, and compared to the mask as shown in FIG. 6A, the mask as shown in FIG. 6B is not beneficial to transfer of the tensile force and is easy to generate wrinkles.

Therefore, with respect to the mask applied to the diamond-shaped pixel arrangement structure, design of the mask applied to the pixel arrangement structure provided by the embodiments of the present disclosure is difficult to generate wrinkles so as to make evaporation more stable and benefit for improving evaporation accuracy.

Another embodiment of the present disclosure provides a method for manufacturing a display substrate by using the FMM set as shown in FIG. 4A to FIG. 4C, the method includes: forming a light-emitting layer of a first-color sub-pixel on a base substrate by using the first opening of the first mask; simultaneously forming light-emitting layers of the two second-color sub-pixels of a second-color sub-pixel pair on the base substrate by using the second opening of the second mask; and forming a light-emitting layer of a third-color sub-pixel on the base substrate by using the third opening of the third mask. The light-emitting layers, which are formed by using the fine metal mask set, of adjacent sub-pixels of two different colors in the first direction are connected with each other; the light-emitting layers, which are respectively formed by using the third opening of the third mask and the second opening of the second mask, of the third-color sub-pixel and the second-color sub-pixel which are adjacent to each other in the second direction are connected with each other; and a spacing is formed between the light-emitting layer, which is formed by using the fine metal mask set, of at least one of the second-color sub-pixel and the third-color sub-pixel which are adjacent to the first-color sub-pixel in the second direction and the light-emitting layer of the first-color sub-pixel. In the process of forming the light-emitting layer of each sub-pixel on the display substrate by using the FMM set provided by the embodiments of the present disclosure, evaporation accuracy is higher and evaporation is more stable.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. The protection scope of the present disclosure should be based on the protection scope of the claims.

The invention claimed is:

1. A display substrate, comprising:
a base substrate; and
a plurality of repeat units on the base substrate, wherein each of the plurality of repeat units comprises one first-color sub-pixel, one second-color sub-pixel pair and one third-color sub-pixel which are arranged in a first direction, the second-color sub-pixel pair comprises two second-color sub-pixels arranging in a second direction, the plurality of repeat units are arranged in the first direction to form a plurality of repeat unit groups, the plurality of repeat unit groups are arranged in the second direction, and adjacent repeat unit groups in the plurality of repeat unit groups are staggered from each other in the first direction,
wherein each sub-pixel comprises a light-emitting layer, and light-emitting layers of adjacent sub-pixels of two different colors in the first direction are connected with each other;
light-emitting layers of the third-color sub-pixel and the second-color sub-pixel which are adjacent to each other in the second direction are connected with each other; and a spacing is disposed between the light-emitting layer of the first-color sub-pixel and the light-emitting layer of at least one of the second-color sub-pixel and the third-color sub-pixel which are adjacent to the first-color sub-pixel in the second direction.

2. The display substrate according to claim 1, wherein light-emitting layers of the two second-color sub-pixels included in the second-color sub-pixel pair are integrated with each other.

3. The display substrate according to claim 2, wherein, in at least one of the plurality of repeat units, an orthogonal projection of one of the light-emitting layer of the second-color sub-pixel pair and the light-emitting layer of the third-color sub-pixel on the base substrate has a maximum area, and an orthogonal projection of the light-emitting layer of the first-color sub-pixel on the base substrate has a minimum area.

4. The display substrate according to claim 2, wherein each of the first-color sub-pixel and the third-color sub-pixel comprises a light-emitting region covering a center of the light-emitting layer and a non-light-emitting region surrounding the light-emitting region, the second-color sub-pixel pair comprises two light-emitting regions covering the light-emitting layer and a non-light-emitting region surrounding the two light-emitting regions, the two light-emitting regions are located on both sides of a center of the light-emitting layer in the second direction, and in at least one of the plurality of repeat units, an area of the light-emitting region of the third-color sub-pixel is greater than an area of the light-emitting region of the second-color sub-pixel and an area of the light-emitting region of the first-color sub-pixel.

5. The display substrate according to claim 4, wherein the light-emitting layer of the first-color sub-pixel, the light-emitting layer of the second-color sub-pixel pair and the light-emitting layer of the third-color sub-pixel have a shape of a hexagon or an oval.

6. The display substrate according to claim 5, wherein the light-emitting region of the first-color sub-pixel and the light-emitting region of the third-color sub-pixel have a shape of the hexagon or the oval, and the light-emitting region of each second-color sub-pixel in the second-color sub-pixel pair has a shape of a pentagon, a circle or a waterdrop shape.

7. The display substrate according to claim 6, wherein, in the first-color sub-pixel and the third-color sub-pixel, a region of the light-emitting layer outside a portion covered by the light-emitting region has an annular shape with approximately equal widths everywhere, and in the second-color sub-pixel pair, a region of the light-emitting layer except a portion covered by the light-emitting regions and a portion between mutually opposite edges of the light-emitting regions of the two second-color sub-pixels has an annular shape with approximately equal widths everywhere.

8. The display substrate according to claim 7, wherein widths of the annular shapes of sub-pixels of different colors are approximately equal to each other.

9. The display substrate according to claim 7, wherein, in each of the plurality of repeat units, a shortest distance between edges of the light-emitting regions of adjacent sub-pixels of two different colors is in a range of 15 to 30 micrometers.

10. The display substrate according to claim 6, wherein a region of the light-emitting layer of the first-color sub-pixel outside a portion covered by the light-emitting region has an annular shape, a width of the annular shape in the first direction is smaller than a width of the annular shape in a third direction, and the third direction is parallel to a shortest connection line between mutually opposite edges of the light-emitting region of the first-color sub-pixel and the light-emitting region of the second-color sub-pixel, which are adjacent to each other in the second direction.

11. The display substrate according to claim 10, wherein a midpoint of the shortest connection line is located on a boundary of the light-emitting layer of the first-color sub-pixel.

12. The display substrate according to claim 5, wherein the light-emitting layer of the first-color sub-pixel and the light-emitting layer of the third-color sub-pixel comprise edges parallel to the second direction, and a midpoint of a shortest connection line between edges, which are opposite to each other in the first direction, of the light-emitting layer of the first-color sub-pixel and the light-emitting layer of the third-color sub-pixel which are adjacent to each other in the first direction and a center of the light-emitting layer of the second-color sub-pixel pair adjacent to the third-color sub-pixel in the second direction are located on a same straight line parallel to the second direction.

13. The display substrate according to claim 12, wherein, in the first direction, a sum of the size of the light-emitting layer of the first-color sub-pixel and the size of the light-emitting layer of the third-color sub-pixel is approximately twice of the size of the light-emitting layer of the second-color sub-pixel pair.

14. The display substrate according to claim 2, wherein, in at least one of the plurality of repeat units, a size of the light-emitting layer of the third-color sub-pixel in the first direction is maximum, and a size of the light-emitting layer of the first-color sub-pixel in the first direction is minimum.

15. The display substrate according to claim 2, wherein, in at least one of the plurality of repeat units, a size of the light-emitting layer of the second-color sub-pixel pair in the second direction is maximum, and a size of the light-emitting layer of the third-color sub-pixel in the second direction is minimum.

16. The display substrate according to claim 2, wherein, for the light-emitting layers of sub-pixels of different colors, ratios of a size in the first direction to a size in the second directions are different.

17. The display substrate according to claim 1, wherein, in at least one of the plurality of repeat units, a size of the light-emitting region of the third-color sub-pixel in the first direction is maximum, and a size of the light-emitting region of the first-color sub-pixel in the first direction is minimum; and in at least one of the plurality of repeat units, a size of the light-emitting region of the first-color sub-pixel and a size of the light-emitting region of the third-color sub-pixel in the second direction are approximately equal, and a size of the light-emitting region of the second-color sub-pixel in the second direction is minimum.

18. A fine metal mask set for evaporating the display substrate according to claim 1, comprising:
 a first mask, comprising a plurality of first openings, each first opening being used for forming the light-emitting layer of the first-color sub-pixel;
 a second mask, comprising a plurality of second openings, each second opening being used for simultaneously forming light-emitting layers of the two second-color sub-pixels of the second-color sub-pixel pair; and
 a third mask, comprising a plurality of third openings, each third opening being used for forming the light-emitting layer of the third-color sub-pixel,
 wherein two openings for evaporating light-emitting layers of adjacent sub-pixels of two different colors in at least one of the plurality of repeat unit groups are configured to have orthogonal projections on the display substrate with boundaries connected with each other;
 the third opening and the second opening which are respectively used for evaporating the light-emitting layer of the third-color sub-pixel and the light-emitting layer of the second-color sub-pixel pair which are adjacent to each other in the second direction are configured to have orthogonal projections on the display substrate, which are connected; and
 the first opening for evaporating the light-emitting layer of the first-color sub-pixel and at least one of the second opening for evaporating the light-emitting layer of the second-color sub-pixel pair and the third opening for evaporating the light-emitting layer of the third-color sub-pixel which are adjacent to the first-color sub-pixel in the second direction are configured to have orthogonal projections on the display substrate, which are spaced.

19. The fine metal mask set according to claim 18, wherein a shape of each first opening is approximately the same as a shape of the light-emitting layer of the first-color sub-pixel; a shape of each second opening is approximately the same as a shape of the light-emitting layer of the second-color sub-pixel pair; and a shape of each third opening is approximately the same as a shape of the light-emitting layer of the third-color sub-pixel.

20. A method for manufacturing the display substrate by using the fine metal mask set according to claim 18, comprising:
 forming the light-emitting layer of the first-color sub-pixel on the base substrate by using the first opening of the first mask;
 forming light-emitting layers of the two second-color sub-pixels of the second-color sub-pixel pair simultaneously on the base substrate by using the second opening of the second mask; and
 forming the light-emitting layer of the third-color sub-pixel on the base substrate by using the third opening of the third mask,
 wherein the light-emitting layers, which are formed by using the fine metal mask set, of adjacent sub-pixels of two different colors in the first direction are connected with each other;
 the light-emitting layers, which are respectively formed by using the third opening of the third mask and the second opening of the second mask, of the third-color sub-pixel and the second-color sub-pixel which are adjacent to each other in the second direction are connected with each other; and
 a spacing is formed between the light-emitting layer of the first-color sub-pixel and the light-emitting layer, which is formed by using the fine metal mask set, of at least one of the second-color sub-pixel and the third-color sub-pixel which are adjacent to the first-color sub-pixel in the second direction.

* * * * *